US010488479B2

(12) United States Patent
Ookawa

(10) Patent No.: US 10,488,479 B2
(45) Date of Patent: Nov. 26, 2019

(54) MRI APPARATUS AND IMAGE PROCESSING APPARATUS

(71) Applicant: TOSHIBA MEDICAL SYSTEMS CORPORATION, Otawara-Shi (JP)

(72) Inventor: Masashi Ookawa, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 85 days.

(21) Appl. No.: 15/621,515

(22) Filed: Jun. 13, 2017

(65) Prior Publication Data

US 2017/0363699 A1 Dec. 21, 2017

(30) Foreign Application Priority Data

Jun. 20, 2016 (JP) .................. 2016-121948

(51) Int. Cl.
*G01R 33/48* (2006.01)
*G01R 33/483* (2006.01)
*G01R 33/54* (2006.01)
*G01R 33/56* (2006.01)
G01R 33/50 (2006.01)
G01R 33/561 (2006.01)

(52) U.S. Cl.
CPC ..... *G01R 33/4828* (2013.01); *G01R 33/4831* (2013.01); *G01R 33/4833* (2013.01); *G01R 33/543* (2013.01); *G01R 33/5608* (2013.01); *G01R 33/50* (2013.01); *G01R 33/5618* (2013.01)

(58) Field of Classification Search
CPC ............ G01R 33/4831; G01R 33/4828; G01R 33/4833; G01R 33/543; G01R 33/5618
See application file for complete search history.

(56) References Cited

U.S. PATENT DOCUMENTS

| 2002/0183614 | A1 | 12/2002 | Feiweier et al. |
| 2010/0239151 | A1* | 9/2010 | Dannels ............... G01R 33/243 382/131 |
| 2011/0140696 | A1 | 6/2011 | Yu |
| 2014/0239950 | A1* | 8/2014 | Ookawa ............... G01R 33/543 324/309 |

FOREIGN PATENT DOCUMENTS

| JP | 2002-325747 | 11/2002 |
| JP | 2011-125703 | 6/2011 |

* cited by examiner

*Primary Examiner* — Patrick Assouad
*Assistant Examiner* — Haidong Zhang
(74) *Attorney, Agent, or Firm* — Oblon, McClelland, Maier & Neustadt, L.L.P.

(57) ABSTRACT

In one embodiment, an MRI apparatus includes: a scanner equipped with at least a static magnetic field magnet, a gradient coil, and an RF coil configured to apply RF pulses to an object and receive magnetic resonance signals from the object; and processing circuitry configured to set a pulse sequence in which refocusing pulses are sequentially applied subsequent to application of one excitation pulse and a predetermined number of magnetic resonance signals are acquired in each period between adjacent two refocusing pulses by using a water/fat separation method, such that the magnetic resonance signals are different in echo time TE for each of the plurality of refocusing pulses, cause the scanner to acquire the magnetic resonance signals under the pulse sequence, and generate a computed image from the magnetic resonance signals, the computed image being a magnetic resonance image of the object obtained by computation.

12 Claims, 19 Drawing Sheets

MRI APPARATUS AND IMAGE PROCESSING APPARATUS

CROSS-REFERENCE TO RELATED APPLICATION

This application is based upon and claims the benefit of priority from Japanese Patent Application No. 2016-121948, filed on Jun. 20, 2016, the entire contents of which are incorporated herein by reference.

FIELD

Embodiments described herein relate generally to a magnetic resonance imaging (MRI) apparatus and an image processing apparatus.

BACKGROUND

An MRI apparatus is an imaging apparatus which magnetically excites nuclear spin of an object placed in a static magnetic field with a radio frequency (RF) pulse having the Larmor frequency and reconstructs an image based on magnetic resonance (MR) signals emitted from the object due to the excitation.

In the field of MRI, a Dixon method is known as a technique of suppressing fat, i.e., technique of generating a fat-suppressed image by using difference in magnetic resonance frequency between fat and water. Note that a fat-suppressed image may be referred to as a water image or a W image. According to the Dixon method, a water-suppressed image (referred to as a fat image or an F image) can also be generated together with a water image.

Meanwhile, in the field of MRI, an imaging technique called "computed imaging" has been developed in recent years. In the computed imaging, tissue parameters, such as a longitudinal relaxation time T1 or a transverse relaxation time T2 are computed from data acquired in actual imaging. Then, an image corresponding to an arbitrary sequence parameter such as an arbitrary echo time TE, which is different from a sequence parameter applied in the actual imaging, is computed based on the computed tissue parameters and acquired data of MR signals. Hereinafter, an image obtained by computation is referred to as a computed image.

DETAILED DESCRIPTION

Hereinafter, embodiments of MRI apparatuses and image processing apparatuses will be described with reference to the accompanying drawings.

In one embodiment, an MRI apparatus includes a scanner equipped with at least a static magnetic field magnet configured to generate a static magnetic field, a gradient coil configured to apply gradient pulses, and an RF coil configured to apply RF pulses to an object and receive magnetic resonance signals from the object; and processing circuitry configured to set a pulse sequence in which a plurality of refocusing pulses are sequentially applied subsequent to application of one excitation pulse and a predetermined number of magnetic resonance signals are acquired in each period between adjacent two refocusing pulses by using a water/fat separation method, in such a manner that the magnetic resonance signals are different in echo time TE for each of the plurality of refocusing pulses, cause the scanner to perform the pulse sequence and acquire the magnetic resonance signals under the pulse sequence, and generate a computed image from the magnetic resonance signals, the computed image being a magnetic resonance image of the object obtained by computation.

(First Embodiment)

Figure 1:
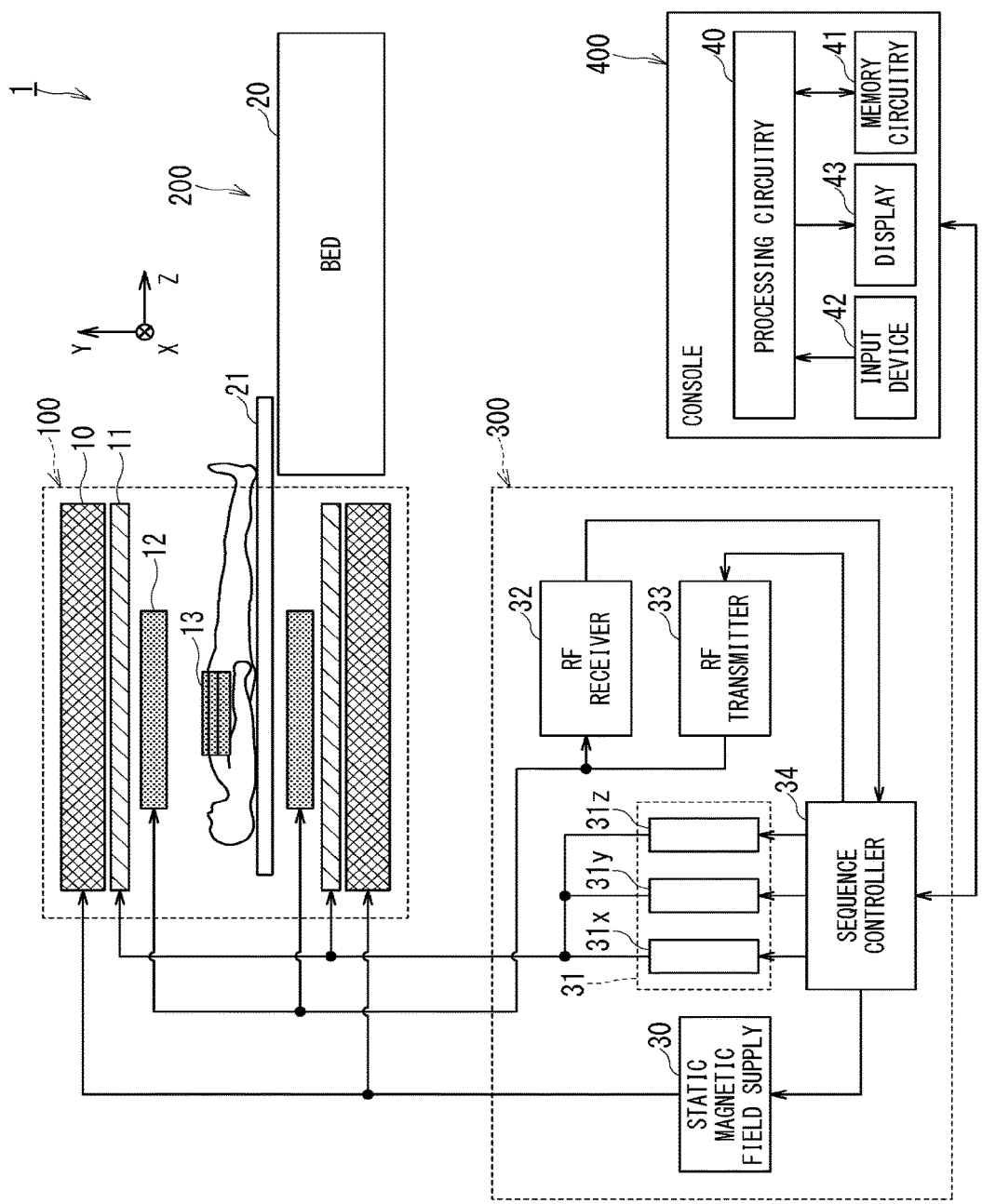
FIG. 1 is a block diagram illustrating overall configuration of the MRI apparatus of the first embodiment.

FIG. 1 is a block diagram illustrating overall configuration of the MRI apparatus 1 of the first embodiment. The MRI apparatus 1 of first embodiment includes at least a gantry 100, a bed 200, a control cabinet 300, and a console 400.

The gantry 100 includes, e.g., a static magnetic field magnet 10, a gradient coil 11, a whole body (WB) coil 12, and these components are included in a cylindrical housing. The bed 200 includes a bed body 20 and a table 21. Additionally, the MRI apparatus 1 further includes an array coil 13 to be placed onto an object.

The control cabinet 300 includes a static magnetic field power supply 30, three gradient coil power supplies 31 (31x for an X-axis, 31y for a Y-axis, and 31z for a Z-axis), an RF receiver 32, an RF transmitter 33, and a sequence controller 34.

The static magnetic field magnet 10 of the gantry 100 is substantially in the form of a cylinder, and generates a static magnetic field inside a bore, which is an imaging region of an object (i.e., a patient). The bore is a space inside the cylindrical structure of the static magnetic field magnet 10. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a static magnetic field power supply 30 in an excitation mode. Afterward, the static magnetic field magnet 10 shifts to a permanent current mode, and the static magnetic field supply 30 is separated. Once it enters the permanent current mode, the static magnetic field magnet 10 continues to generate a strong static magnetic field for a long time, e.g., over one year. Note that the static magnetic field magnet 10 may be configured as a permanent magnet.

The gradient coil 11 is also substantially in the form of a cylinder, and is fixed to the inside of the static magnetic field magnet 10. This gradient coil 11 applies gradient magnetic fields to an object in the respective directions of the X-axis, the Y-axis, and the Z-axis, by using electric currents supplied from the gradient coil power supplies 31x, 31y, and 31z.

The bed body 20 of the bed 200 can move the table 21 in the upward and downward directions, and moves the table 51 with an object loaded thereon to a predetermined height before imaging. Afterward, when the object is imaged, the bed body 20 moves the table 21 in the horizontal direction so as to move the object to inside of the bore.

The WB body coil is shaped substantially in the form of a cylinder so as to surround an object, and is fixed to the inside of the gradient coil 11. The WB coil 12 applies RF pulses transmitted from the RF transmitter 33 to the object, and receives MR signals emitted from the object due to excitation of hydrogen nuclei.

The array coil 13 is an RF coil, and receives MR signals emitted from the object at positions adjacent to the object. The array coil 13 is, for instance, configured of plural coil elements. Although there are various types for the array coil 13 such as a head coil, a chest coil, a spine coil, a lower limb coil, and a whole-body type coil according to an anatomical imaging part of the object, the array coil 13 for the chest part is illustrated in FIG. 1.

The RF transmitter 33 transmits RF pulses to the WB coil 12 based on commands inputted from the sequence controller 34.

The RF receiver 32 receives MR signals received by the WB coil 12 and/or the array coil 13, and transmits raw data obtained by digitizing the received MR signals to the sequence controller 34.

The sequence controller 34 performs a scan of the object by driving the gradient coil power supplies 31, the RF transmitter 33, and the RF receiver 32, under the control of the console 400. When the sequence controller 34 receives raw data from the RF receiver 32 by performing a scan, the sequence controller 34 transmits the received raw data to the console 400.

The sequence controller 34 includes non-illustrated processing circuitry, which may be configured as a processor for executing predetermined programs or be configured as hardware such as a field programmable gate array (FPGA) or an application specific integrated circuit (ASIC).

The console 400 is configured as a computer which includes processing circuitry 40, memory circuitry 41, an input device 42, and a display 43.

The memory circuitry 41 is a recording medium including a read-only memory (ROM) and a random access memory (RAM) in addition to an external memory device such as a hard disk drive (HDD) and an optical disc device. The memory circuitry 41 stores various programs executed by a processor of the processing circuitry 40 as well as various types of data and information.

The input device 42 includes various devices for an operator to input various types of information and data, and is configured of, e.g., a mouse, a keyboard, a trackball, and/or a touch panel.

The display 43 is a display device such as a liquid crystal display panel, a plasma display panel, and an organic EL panel.

The processing circuitry 40 is, e.g., a circuit equipped with a central processing unit (CPU) and/or a special-purpose or general-purpose processor. The processor implements various functions described below by executing programs stored in the memory circuitry 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the magnetic resonance imaging apparatus 1. Specifically, the console 400 receives commands and various types of information such as imaging conditions inputted via, e.g., a mouse and a keyboard (of the input device 42) operated by an operator such as an MRI technician. Then, the processing circuitry 40 causes the sequence controller 34 to perform a scan on the basis of the inputted imaging conditions, and then reconstructs images on the basis of raw data transmitted from the sequence controller 34. Reconstructed images are displayed on the display 43 and stored in the memory circuitry 41.

The MRI apparatus 1 of the first embodiment acquires MR signals from an object to generate normal images and component-separated images such as a water image and a fat image by executing a predetermined pulse sequence based on the Dixon method. Here, a water image is an image in which a fat component is suppressed and is also referred to as a W image. Meanwhile, a fat image is an image in which a water component is suppressed and is also referred to as a F image. Additionally, a normal image is an image in which neither a water component nor a fat component is suppressed and is sometimes referred to as a W+F image. The Dixon method is an imaging method capable of generating an image in which a water component and a fat component are separated from each other, and thus the Dixon method is also referred to as a water/fat separation method.

The MRI apparatus 1 of the first embodiment generates a computed image from a normal image and a component-separated image such as a water image generated in the actual imaging. By means of the computed image, an image corresponding to an arbitrary sequence parameter (e.g., arbitrary echo time TE), which is different from the sequence parameter used in the actual imaging, can be obtained.

Figure 2:
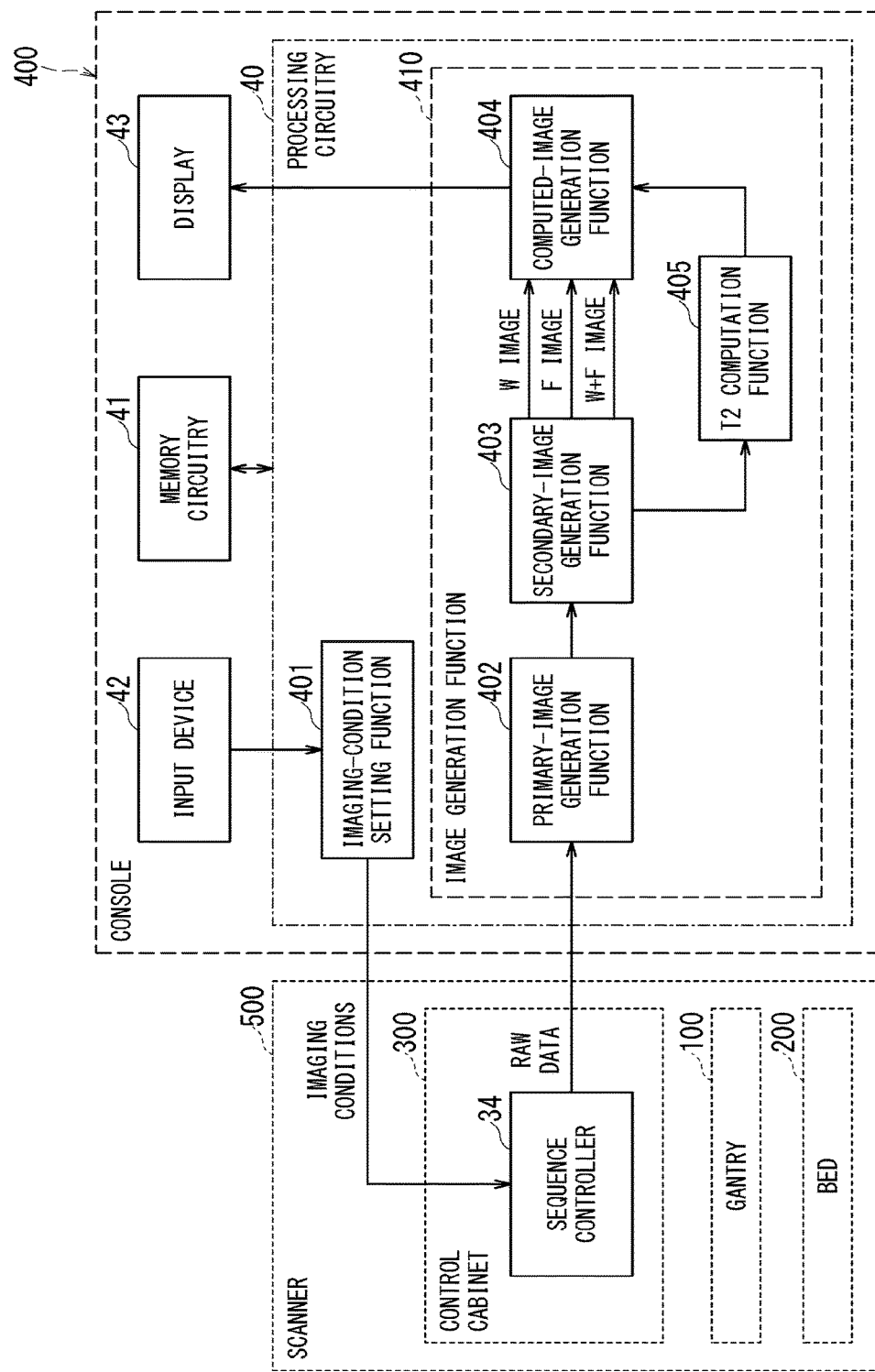
FIG. 2 is a block diagram illustrating components related to generation of computed images according to the MRI apparatus of the first embodiment.

FIG. 2 is a block diagram illustrating components related to the above-described generation of component-separated images such as a water image and generation of computed images according to the MRI apparatus 1 of the first embodiment. As shown in FIG. 2, the processing circuitry 40 of the MRI apparatus 1 includes an imaging-condition setting function 401, a primary-image generation function 402, a secondary-image generation function 403, a computed-image generation function 404, and a T2 computation function 405. The entirety of the primary-image generation function 402, the secondary-image generation function 403, the computed-image generation function 404, and the T2 computation function 405 constitutes an image generation function 410. As described above, the processor of the processing circuitry 40 implements each of those functions by executing predetermined programs, for example.

Additionally, out of the components of the MRI apparatus 1 shown in FIG. 1, all the components except for the console 400 (i.e., the control cabinet 300, the gantry 100, and the bed 200) constitute a scanner 500. Since the memory circuitry 41, the input device 42, and the display 43 shown in FIG. 2 are the same as those in FIG. 1, and the same reference signs as FIG. 1 are assigned in FIG. 2.

Out of the above-described components, the imaging-condition setting function 401 sets imaging conditions such as a type of a pulse sequence to be used in actual imaging and various parameters of the pulse sequence on the sequence controller 34. For instance, these imaging conditions are inputted by an operator via the input device 42. Additionally or alternatively, an operator can change previously stored imaging conditions by operating the input device 42.

Prior to detailed description of pulse sequences used in the present embodiment and the image generation function 410, the entire signal processing of the MRI apparatus 1 of the present embodiment will be briefly described with reference to FIG. 3.

Figure 3:
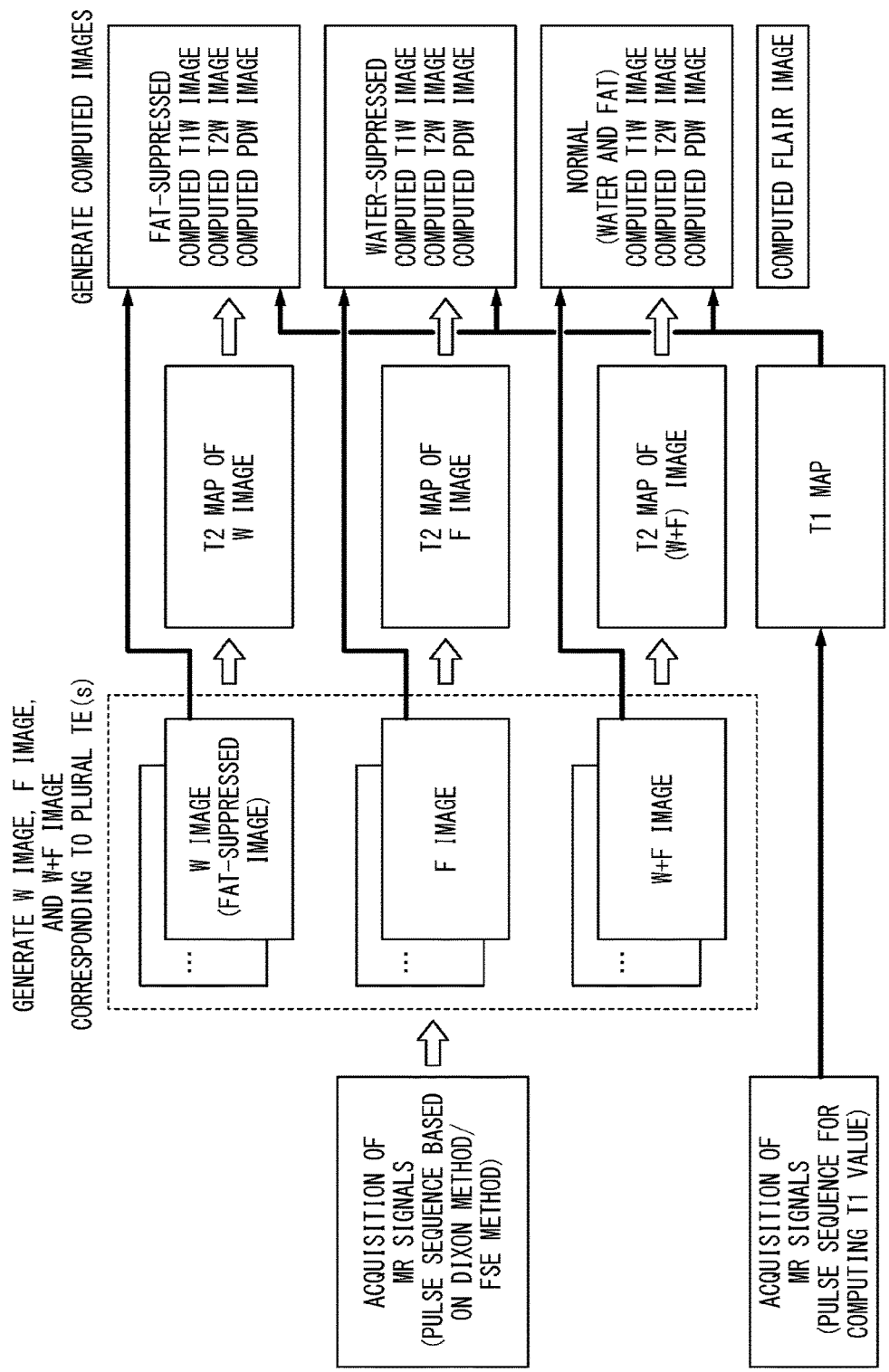
FIG. 3 is a schematic diagram illustrating outline of the entire processing performed by the MRI apparatus of the first embodiment.

The upper part of the leftmost block in FIG. 3 shows processing of acquiring MR signals from an object by executing a pulse sequence which is based on the Dixon method and the FSE (Fast Spin Echo) method. Since a pulse sequence of the FSE type is applied, plural MR signals corresponding to plural different echo times TE are acquired.

The second leftmost block in FIG. 3 shows processing of generating water images, fat images, and normal images, which each correspond to the plural different echo times TE, from acquired MR signals.

The third leftmost block in FIG. 3 shows processing of computing values of transverse relaxation times T2 of respective pixels by using pixel values of each of the water images, the fat images, and the normal images generated as described above. Here, a transverse relaxation time T2 is a tissue parameter of an object, and a dataset obtained by computing transverse relaxation times T2 of respective pixels are referred to as a T2 map.

The lower part of the leftmost block in FIG. 3 shows processing of acquiring MR signals from an object by actual imaging using a particular pulse sequence for computing a value of each longitudinal relaxation time T1. Here, a longitudinal relaxation time T1 is a tissue parameter of an object which is an imaging target. A T1 map is generated by computing longitudinal relaxation times T1 of respective pixels from MR signals acquired in the actual imaging.

The rightmost block in FIG. 3 shows processing of generating a computed image, corresponding to an arbitrary sequence parameter such as an arbitrary echo time TE by computation. In this computation, the image generation function 410 generates the computed image based on pixel values of each of the water image, the fat image, and the normal image generated from the actually acquired MR signals and also based on a combination of computed T1 values and T2 values. For instance, a fat-suppressed computed image of a T2 weighted image (Computed T2W image) and a fat-suppressed computed image of a proton density (PD) weighted image (Computed PDW image) can be generated from pixel values of a water image, computed T2 values, and computed T1 values. Additionally, for instance, a fat-suppressed computed image of a T1 weighted image (Computed T1W image) can be generated from pixel values of a water image, computed T2 values, and computed T1 values.

These computed images of a T2 weighted image, a PD weighted image, and a T1 weighted image can be generated not only from a fat-suppressed water image but also from a water-suppressed fat image and/or a normal image.

Additionally, it is possible to generate an image corresponding to a fluid attenuated inversion recovery (FLAIR) image, in which a moving component of biological fluid such as cerebrospinal fluid (CSF) is suppressed, as a computed image (Computed FLAIR image) by appropriately correcting phase variation and amplitude variation due to movement of spins (i.e., movement of hydrogen atoms).

Figure 4:
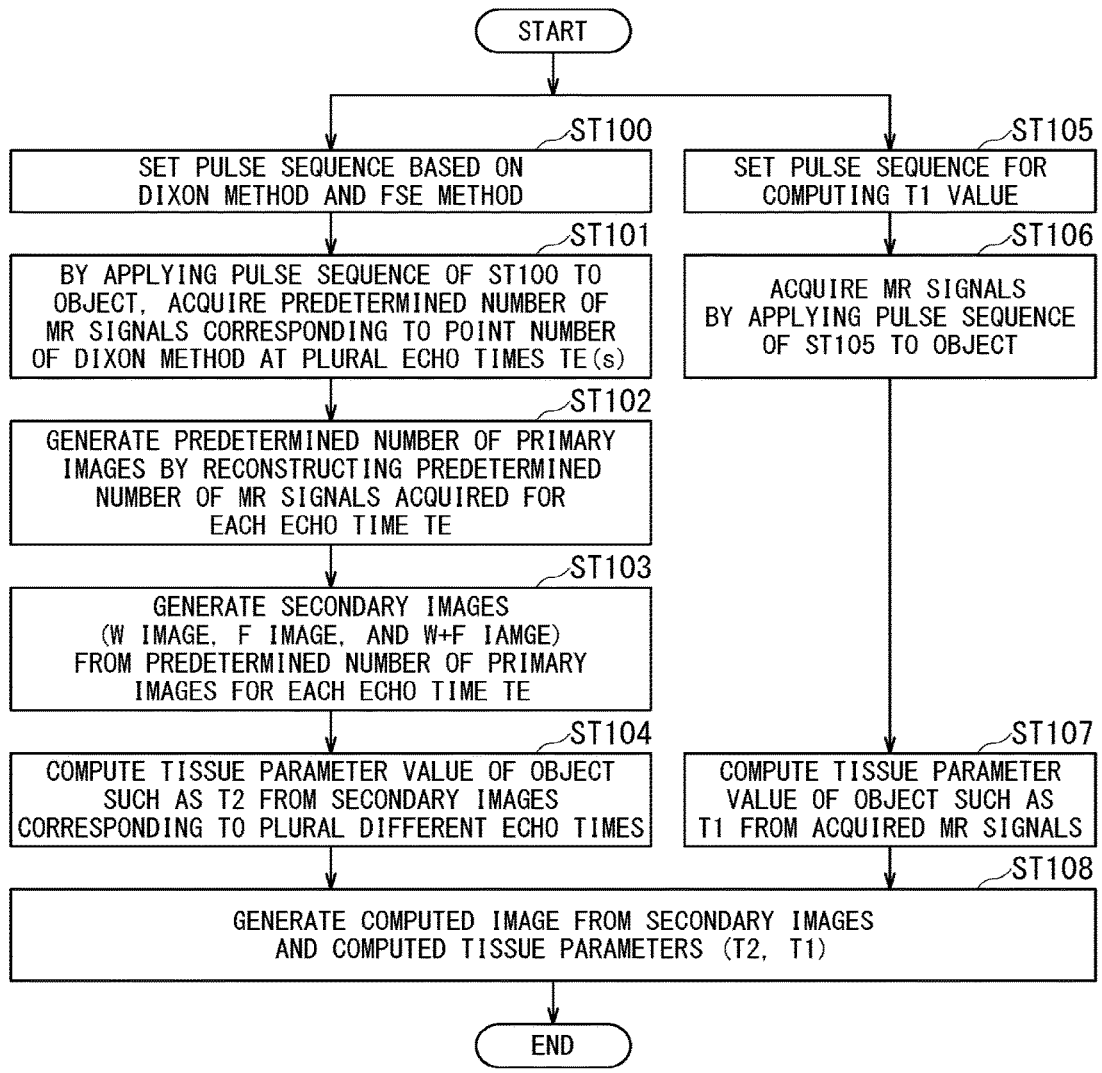
FIG. 4 is a flowchart illustrating one of operations performed by the MRI apparatus of the first embodiment.

FIG. 4 is a flowchart illustrating one of operations performed by the MRI apparatus 1 of the first embodiment. Hereinafter, detailed processing performed by the MRI apparatus 1 of the first embodiment will be described according to the step number in the flowchart of FIG. 4 with reference to FIG. 5 to FIG. 10 as required.

In the step ST100 of FIG. 4, the processing circuitry 40 sets a pulse sequence based on the Dixon method and the FSE method, and this processing of the step ST100 corresponds to its imaging-condition setting function 401 in FIG. 2.

Figure 5:
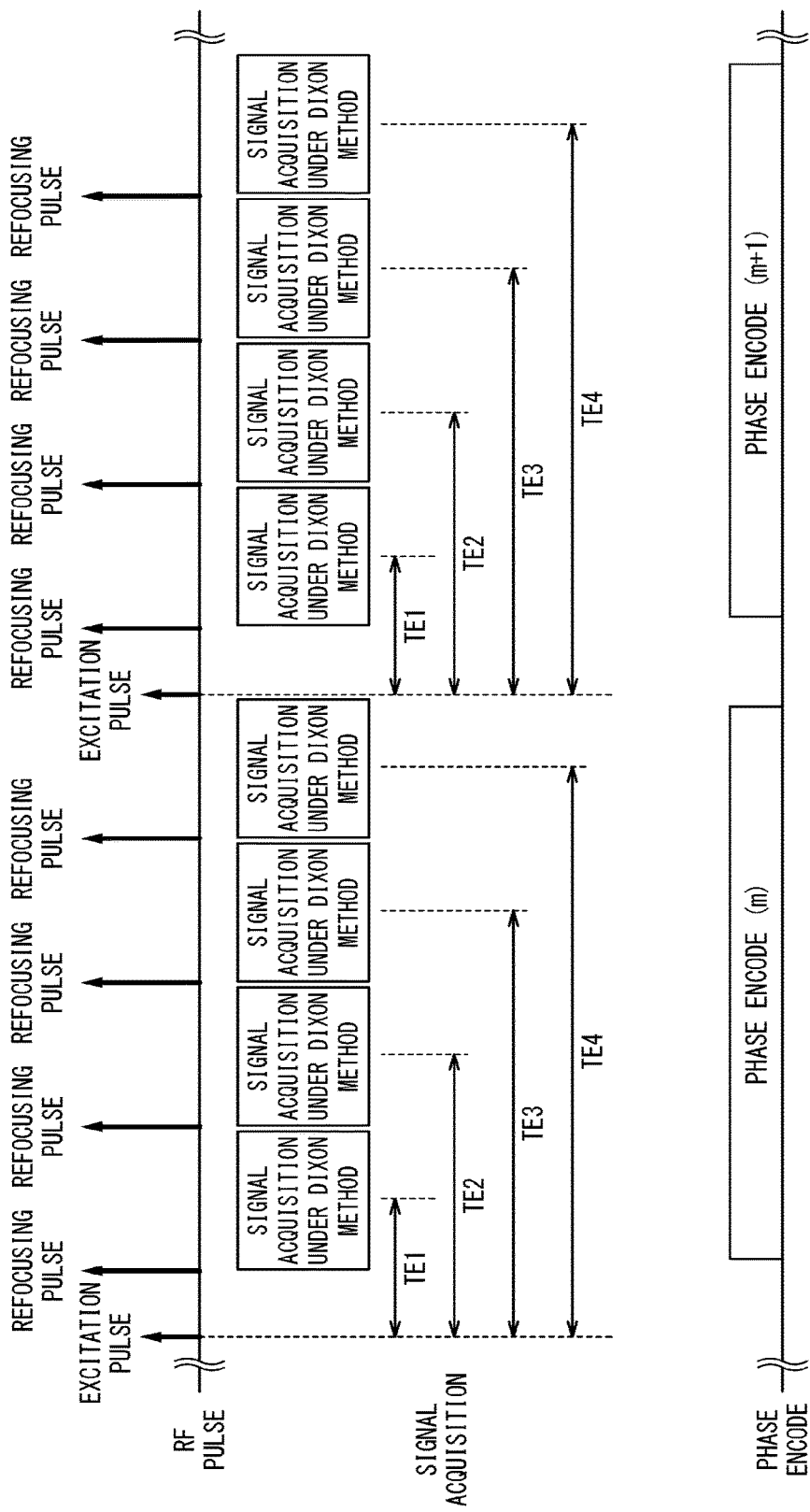
FIG. 5 is a timing chart illustrating a basic part of a pulse sequence to be executed by the MRI apparatus of the first embodiment.

FIG. 5 is a timing chart illustrating a basic part of a pulse sequence set in the step ST100. Although some detailed pulse sequences are described below, the basic part in FIG. 5 is common to any of the detailed pulse sequences described below.

The uppermost part of FIG. 5 shows an RF pulse train. This RF pulse is basically the same as an RF pulse train of the FSE method, and plural refocusing pulses are applied after applying one excitation pulse. Then, as shown in the middle part of FIG. 5, the scanner 500 in FIG. 2 acquires MR signals whose echo times TE are different for each refocusing pulse. Although the number of a series of refocusing pulses subsequent to one excitation pulse is not limited to specific number, at least two refocusing pulses for each excitation pulse is necessary in order to calculate a T2 value. Preferably, each excitation pulse is followed by three or more refocusing pulses. Calculation accuracy of T2 values is improved by increasing the number of refocusing pulses for each excitation pulse. In other words, by increasing the number of data corresponding to different echo times TEs, calculation accuracy of T2 values can be improved. In the case of FIG. 5, each excitation pulse is followed by four refocusing pulses and data corresponding to four echo times TE1, TE2, TE3, and TE4 are acquired.

In each period "between one refocusing pulse and the next refocusing pulse" (hereinafter, shortly referred to as each period "between two refocusing pulses closest to each other", or "between adjacent two refocusing pulses"), a predetermined number of echo trains (i.e., MR-signal trains) are acquired by the Dixon method, which predetermined number corresponds to point number of the Dixon method. For instance, when a two-point Dixon method is used, two MR-signal trains are acquired in each period between adjacent two refocusing pulses, and when a three-point Dixon method is used, three MR-signal trains are acquired in each period between adjacent two refocusing pulses. In other words, when an M-point Dixon method is used, M MR-signal trains are acquired in each period between adjacent two refocusing pulses. Note that one MR-signal train is composed of all the signals in the readout direction in k-space.

Note that, in the pulse sequence shown in FIG. 5, the same phase encode is set on a series of refocusing pulses which follows one excitation pulse. In the case of FIG. 5, a common phase encode (m) is set to each of the four refocusing pulses subsequent to the first excitation pulse, and a phase encode (m+1) different from the phase encode (m) is set to each of the four refocusing pulses subsequent to the second excitation pulse.

In the conventional FSE method, phase encode amount is changed for each refocusing pulse in order to achieve fast imaging. By contrast, in each pulse sequence in the present embodiment, plural echo times TEs different from each other are set to the same phase encode amount for computing tissue parameters such as a T2 value from the resulting MR signals. Since each pulse sequence of the present embodiment is different in imaging purpose from any pulse sequence of the conventional FSE method as described above, the method of setting phase encode in the present embodiment is different from the conventional FSE method.

Incidentally, in a pulse sequence of an imaging method called a GRASE (gradient and spin echo) method, each excitation pulse is followed by plural refocusing pulses similarly to the FSE method, and plural readout gradient pulses are applied in each period between adjacent two refocusing pulses such that positive/negative polarities of the respective readout gradient pulses are alternately reversed. It can be said that the GRASE method is a combination of the FSE method and the echo planar imaging (EPI) method. Also in the GRASE method, phase encode amount is changed for each readout gradient pulse and for each refocusing pulse. In this respect, the method of setting phase encode in the present embodiment shown in FIG. 5 is quite different from the method of setting phase encode in the GRASE method.

Figure 6:
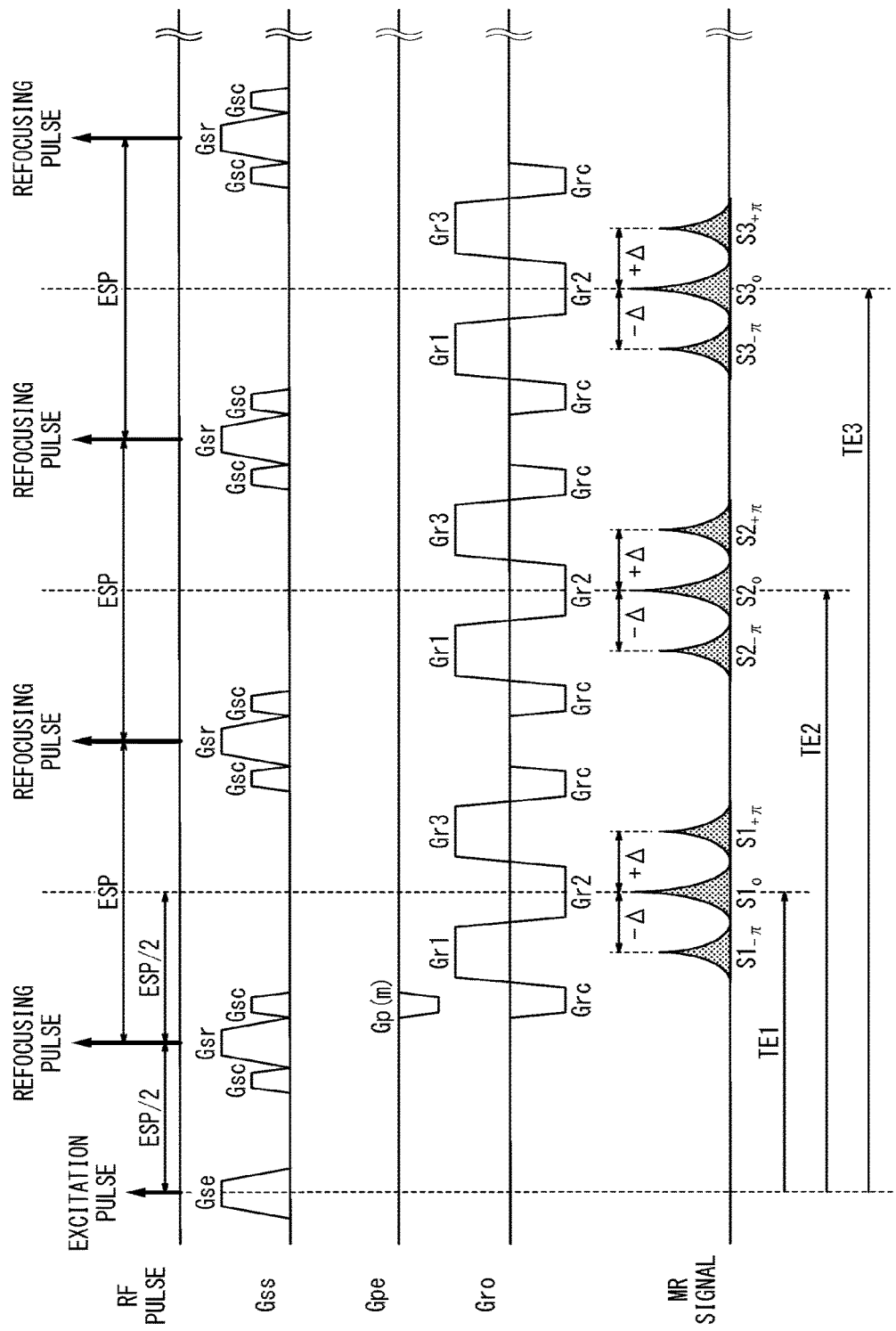
FIG. 6 is a timing chart illustrating a detailed pulse sequence executed by the MRI apparatus of the first embodiment.

FIG. 6 is a timing chart illustrating a detailed pulse sequence executed by the MRI apparatus 1 of the present embodiment (hereinafter, referred to as the first pulse sequence). While two excitation pulses and plural refocusing pulses immediately subsequent to each excitation pulse are illustrated in FIG. 5, only a partial period during which one excitation pulse and the following plural refocusing pulses are applied is illustrated in FIG. 6 for avoiding complication. This point applies to FIG. 11, FIG. 12, and FIG. 13 in each of which another detailed pulse sequence is illustrated. FIG. 6 illustrates a pulse sequence which is based on the FSE method and the three-point Dixon method.

The uppermost part of FIG. 6 shows an excitation pulse and a series of refocusing pulses subsequent to this excitation pulse. A flip angle of an excitation pulse is generally set to 90 degrees, but may be set to a value smaller than 90 degrees. A flip angle of each refocusing pulse is generally set to 180 degrees, but may be set to a value smaller than 180 degrees in terms of, e.g., suppression of specific absorption rate (SAR). When each interval between adjacent two refocusing pulses is defined as ESP (echo spacing), the interval between one excitation pulse and the first refocusing pulse is set to ESP/2.

The second uppermost part of FIG. 6 shows slice selective gradient pulses Gss. Each slice selective gradient pulse applied in synchronization with the excitation pulse is indicated as Gse, and each slice selective gradient pulse applied in synchronization with each refocusing pulse is indicated as Gsr. In general, a pulse sequence is set such that each slice selective gradient pulse Gse and each slice selective gradient pulse Gsr are applied to the same slice.

A pair of gradient pulses Gsc called crusher gradient pulses are applied before and after each refocusing pulse. Although a free induction decay (FED) signal is generated due to each refocusing pulse when the flip angle of each refocusing pulse is not 180 degrees, phase of this FID signal is dispersed by the crusher gradient pulse applied immediately after each refocusing pulse and thereby this FID signal disappears. A transverse magnetization component caused by the excitation pulse is once dephased by the crusher gradient pulse applied immediately before the first refocusing pulse, but is rephased by the crusher gradient pulse applied immediately after the first refocusing pulse by the same amount as the dephased amount. Thus, the transverse magnetization component caused by the excitation pulse is kept unchanged before and after application of each refocusing pulse. As a result, the two crusher gradient pulses before and after each refocusing pulse do not influence a spin echo component.

The third uppermost part of FIG. 6 shows a phase encoding gradient pulse. As described above, the same phase encode is set to each of a series of refocusing pulses immediately subsequent to one excitation pulse in each pulse sequence of the present embodiment. For this reason, only one phase encoding gradient pulse Gp(m) is applied subsequent to the first refocusing pulse which is applied immediately after the excitation pulse, as shown in third uppermost part of FIG. 6. As a result, a common phase encode amount defined by the phase encoding gradient pulse Gp(m) is set to every MR signal acquired by a series of refocusing pulses which are sequentially applied immediately after one excitation pulse The fourth uppermost part of FIG. 6 shows readout gradient pulses. Out of the five readout gradient pulses between adjacent two refocusing pulses, the first Grc indicates a prephasing gradient pulse, Gr1, Gr2, and Gr3 indicate respective three readout gradient pulses corresponding to the three-point Dixon method, and the last Grc indicates a rephasing gradient pulse. The same combination of five readout gradient pulses as above is repeated in each period between adjacent two refocusing pulses.

The prephasing gradient pulse has a negative polarity, and is applied in order to allow the MR signal to peak at the temporal center of the application period of the readout gradient pulse Gr1 which is applied immediately after this prephasing gradient pulse (as shown in the fifth uppermost part of FIG. 6).

The pulse sequence shown in FIG. 6 is set in such a manner that the three readout gradient pulses Gr1, Gr2, and Gr3 corresponding to the three-point Dixon method alternate between positive and negative polarities. Note that point number of the Dixon method is not limited to three. For instance, in the case of the two-point Dixon method, two readout gradient pulses whose polarities are opposite to each other are applied in each period between adjacent two refocusing pulses. In the case of the M-point Dixon method (where M is four or more), four or more readout gradient pulses are applied in each period between adjacent two refocusing pulses.

The last rephasing gradient pulse Grc is applied in order to rewind the phase of each spin in the readout direction to the state that is immediately after application of a refocusing pulse.

The bottom part of FIG. 6 shows MR signals that are read out by respective three readout gradient pulses Gr1, Gr2, and Gr3. In FIG. 6, the reference signs $S1_{-\pi}$, $S1_0$, and $S1_{+\pi}$ indicate the respective three MR signals read out by the respective readout gradient pulses Gr1, Gr2, and Gr3 which correspond to the first refocusing pulse. Similarly, the reference signs $S2_{-\pi}$, $S2_0$, and $S2_{+\pi}$ indicate the respective three MR signals to be read out by the respective readout gradient pulses Gr1, Gr2, and Gr3 which correspond to the second refocusing pulse. Similarly, the reference signs $S3_{-\pi}$, $S3_0$, and $S3_{+\pi}$ indicate the respective three MR signals to be read out by the respective readout gradient pulses Gr1, Gr2, and Gr3 which correspond to the third refocusing pulse.

Additionally, in FIG. 6, out of the nine MR signals corresponding to the first to third refocusing pulses, the echo times TE (i.e., delay times from the excitation pulse) of the three central MR signals $S1_0$, $S2_0$, and $S3_0$ are respectively indicated as TE1, TE2, and TE3. In the pulse sequence shown in FIG. 6, TE1 is the same as the interval ESP of refocusing pulses (TE1=ESP), TE2 is twice as long as the interval ESP of refocusing pulses (TE2=2*ESP=2*TE1), and TE3 is three times as long as the interval ESP of refocusing pulses (TE3=3*ESP=3*TE1).

Each readout gradient pulse Gr1 is set in such a manner that the echo time of the corresponding MR signal becomes shorter by Δ than that of the following readout gradient pulse Gr2. Additionally, each readout gradient pulse Gr3 is set in such a manner that the echo time of the corresponding MR signal becomes longer by Δ than that of the central readout gradient pulse Gr2 applied immediately before this readout gradient pulse Gr3. This difference Δ in echo time allows respective phases of a fat component and a water component to become values different from each other. In the case of each MR signal to be read out by the central readout gradient pulse Gr2, the phase of its fat component and the phase of its water component become equal to each other at the center of k-space (i.e., phase difference is zero), and these MR signals are indicated as $S1_0$, $S2_0$, $S3_0$ in the application order of the refocusing pulses. As to each MR signal read out by the readout gradient pulse Gr1 that is applied earlier by Δ than the readout gradient pulse Gr2, Δ is set such that the phase difference between its fat component and its water component becomes −π (i.e., −180° at the center of k-space. Accordingly, these MR signals are indicated as $S1_{-\pi}$, $S2_{-\pi}$, $S3_{-\pi}$. Additionally, as to each MR signal read out by the readout gradient pulse Gr3 that is applied later by Δ than the readout gradient pulse Gr2, the phase difference between its fat component and its water component becomes +π (i.e., +180° at the center of k-space. Accordingly, these MR signals are indicated as $S1_{+\pi}$, $S2_{+\pi}$, $S3_{+\pi}$.

Returning to FIG. 4, after setting the pulse sequence shown in FIG. 6 in the step ST100 as described above, in the next step ST101, the scanner 500 performs this pulse sequence so as to acquire predetermined number of MR signals corresponding to point number of the Dixon method from the object at plural echo times TE which are different from each other. In the case of the pulse sequence shown in FIG. 6, the scanner 500 acquires, e.g., three MR signals (i.e., $S1_{-\pi}$, $S1_0$, $S1_{+\pi}$) corresponding to the echo time TE1 in the three-point Dixon method, three MR signals (i.e., $S2_{-\pi}$, $S2_0$, $S2_{-\pi}$) corresponding to the echo time TE2 in the three-point Dixon method, and three MR signals (i.e., $S3_{-\pi}$, $S3_0$, $S3_{+\pi}$) corresponding to the echo time TE3 in the three-point Dixon method. The processing of the step ST101 is performed by the scanner 500 in FIG. 2.

Note that FIG. 6 shows only a part of the entire pulse sequence corresponding to one phase encode amount. Actually, the partial sequence shown in FIG. 6 is repeated by predetermined phase encode number (e.g., 128) at intervals of a predetermined repetition time TR, while phase encode amount is being changed for each repetition time TR. The repetition time TR is an interval between one excitation pulse and the next excitation pulse.

In the next step ST102, the processing circuitry 40 generates predetermined number of primary images by reconstructing the predetermined number of acquired MR signals for each echo time TE. Here, an image before separation of water and fat is referred to as the primary image. The processing of step ST102 corresponds to the primary-image generation function 402 of the processing circuitry 40 in FIG. 2.

In the next step ST103, the processing circuitry 40 generates a normal image (i.e., W+F image) and the secondary images (i.e., a water image (W image) and a fat image (F image)) from the predetermined number of the primary images for each echo time, according to its secondary-image generation function 403 shown in FIG. 2.

Figure 7:
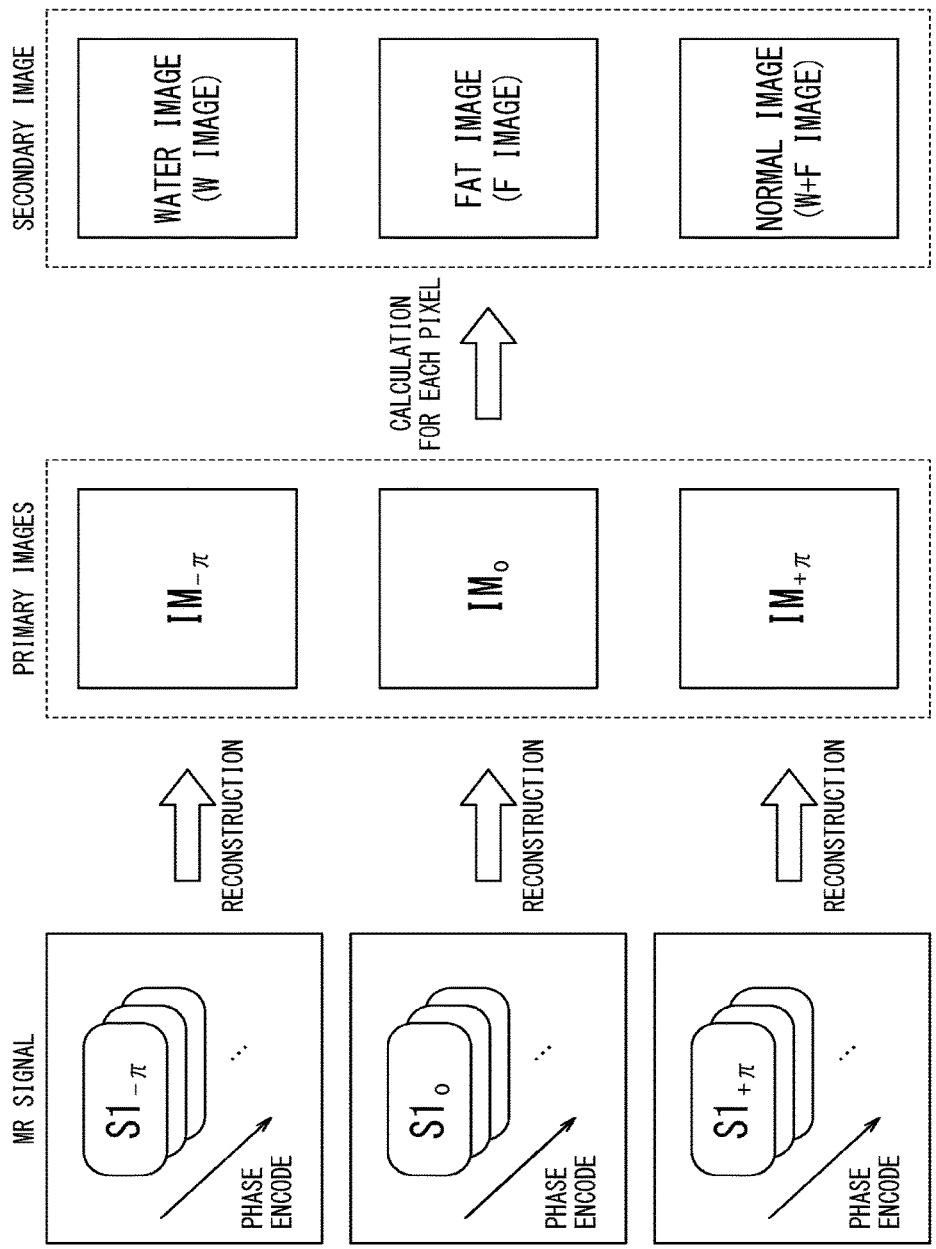
FIG. 7 is a schematic diagram illustrating a concept of processing of generating primary images from acquired MR signals.
Figure 8:
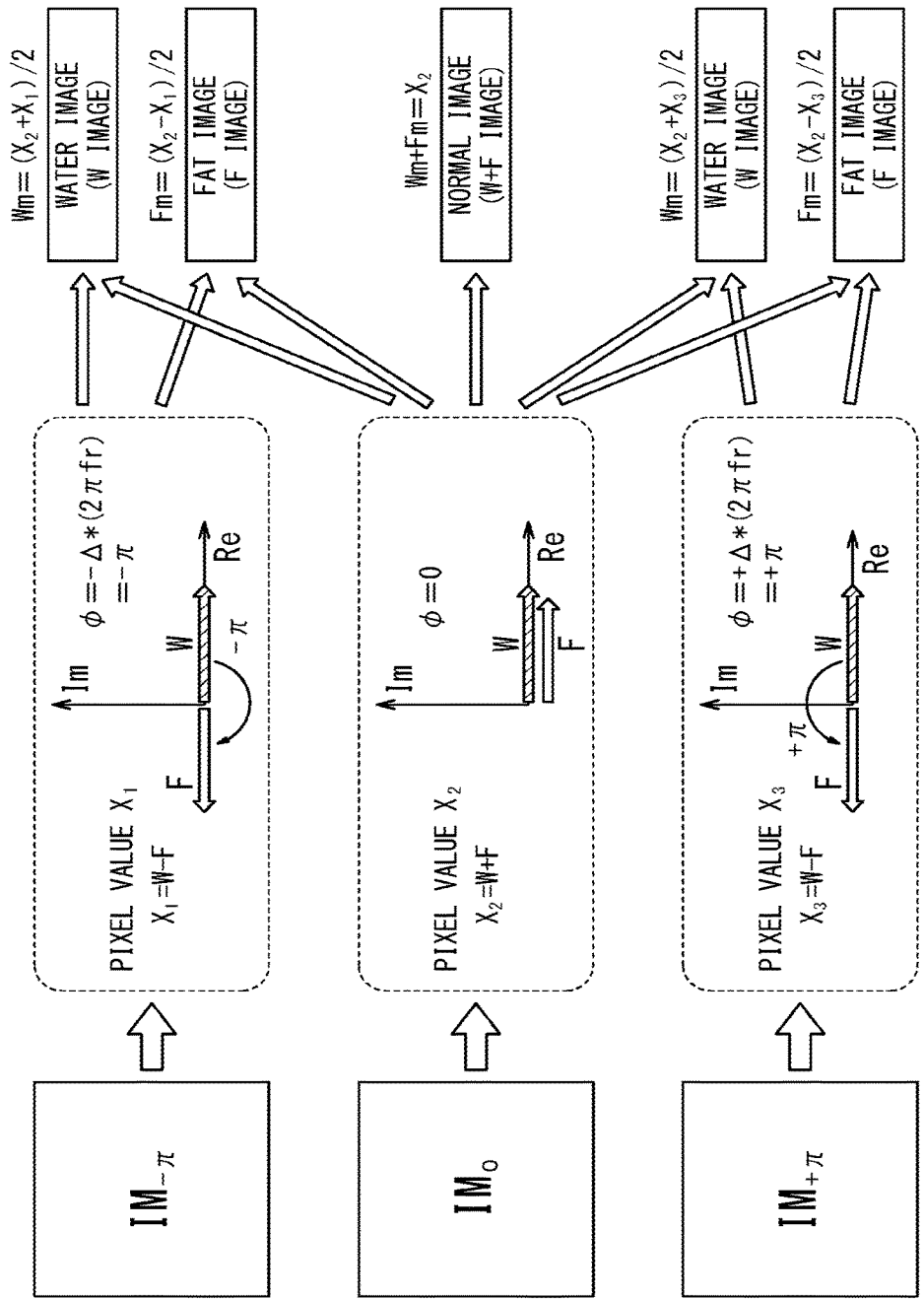
FIG. 8 is a schematic diagram illustrating a concept of processing of generating secondary images from primary images.

FIG. 7 and FIG. 8 are schematic diagrams illustrating concept of the processing of the steps ST102 and ST103.

Out of the three MR signals ($S1_{-\pi}$, $S1_0$, $S1_{+\pi}$) corresponding to the echo time TE1 in the three-point Dixon method shown in FIG. 6, the MR signal $S1_{-\pi}$ is shown in the upper part of the left block in FIG. 7, and actually, a set of MR signals $S1_{-\pi}$ i.e., the predetermined phase encode number of MR signals $S1_{-\pi}$ are acquired while the phase encode amount is being changed for each repetition time TR. The processing circuitry 40 reconstructs a set of MR signals $S1_{-\pi}$ by processing such as two-dimensional inverse Fourier transform so as to generate the primary image $IM_{-\pi}$ corresponding to an image in which phase difference between a water component and a fat component is −π.

Out of the three MR signals ($S1_{-\pi}$, $S1_0$, $S1_{+\pi}$) corresponding to the echo time TE1 in the three-point Dixon method, the MR signal $S1_0$ is shown in the middle part of the left block in FIG. 7, and actually, a set of MR signals $S1_0$ i.e., the predetermined phase encode number of MR signals $S1_0$ are acquired while the phase encode amount is being changed for each repetition time TR. The processing circuitry 40 reconstructs a set of MR signals $S1_0$ by processing such as two-dimensional inverse Fourier transform so as to generate the primary image $IM_0$ corresponding to an image in which phase difference between a water component and a fat component is zero.

Similarly, out of the three MR signals ($S1_{-\pi}$, $S1_0$, $S1_{+\pi}$) corresponding to the echo time TE1 in the three-point Dixon method, the MR signal $S1_{+\pi}$ is shown in the bottom part of the left block in FIG. 7, and actually, a set of MR signals $S1_{+n}$ i.e., the predetermined phase encode number of MR signals $S1_{+\pi}$ are acquired while the phase encode amount is being changed for each repetition time TR. The processing circuitry 40 reconstructs a set of MR signals $S1_{+\pi}$ by processing such as two-dimensional inverse Fourier transform so as to generate the primary image $IM_{+\pi}$ corresponding to an image in which phase difference between a water component and a fat component is +π.

As described above, the primary images $IM_{-\pi}$, $IM_0$, $IM_{+\pi}$ before separation of water and fat are generated so as to respectively correspond to the echo times TE1, TE2, TE3 in the step ST102 as shown in the central dashed-line block in FIG. 7. Although three types of primary images are generated in the case of the three-point Dixon method, M types of primary images are generated for the respective echo times TE1, TE2, TE3, . . . , TEM in the case of the M-point Dixon method.

FIG. 8 is a schematic diagram illustrating a general concept of the Dixon method in which the secondary images i.e., a water image (W image), a fat image (F image), and a normal image (W+F image) are generated from the primary images $IM_{-\pi}$, $IM_0$, $IM_{+\pi}$. In FIG. 8, it is assumed that neither non-uniformity of a static magnetic field nor non-uniformity of a magnetic field due to magnetic susceptibility distribution of an object exists and attenuation due to T2 relaxation does not exist.

As to respective three pixels of the primary images $IM_{-\pi}$, $IM_0$, and $IM_{+\pi}$ which are at the same position, pixel values of those three pixels of the primary images $IM_{-\pi}$, $IM_0$, and $IM_{+\pi}$ are respectively defined as $X_1$, $X_2$, and $X_3$, and each of those three pixels is assumed to include a water component with magnitude W and a fat component with magnitude F. Each of W and F is a positive real number. Here, difference in magnetic resonance frequency between a water component and a fat component is defined as fr. Additionally, the value of $\Delta$ in FIG. 6 is set in such a manner that the phase difference $\varphi$ of the fat component with respect to the water component in the primary image $IM_{-\pi}$ satisfies the following formula (1).

$$\varphi = -\Delta*(2\pi fr) = -\pi \qquad \text{Formula (1)}$$

Thus, the pixel value $X_1$ of the primary image $IM_{-\pi}$ is given by the following formula (2).

$$X_1 = W - F \qquad \text{Formula (2)}$$

Additionally, the phase difference $\varphi$ of the fat component with respect to the water component in the primary image $IM_0$ is $\varphi=0$, because $\Delta$ is zero in this case. Thus, pixel value $X_2$ of the primary image $IM_0$ is given by the following formula (3).

$$X_2 = W + F \qquad \text{Formula (3)}$$

Additionally, the phase difference $\varphi$ of the fat component with respect to the water component in the primary image $IM_{+\pi}$ is given by the following formula (4).

$$\varphi = +\Delta*(2\pi fr) = +\pi \qquad \text{Formula (4)}$$

Thus, the pixel value $X_3$ of the primary image $IM_0$ is given by the following formula (5) similarly to the pixel value $X_1$.

$$X_3 = W - F \qquad \text{Formula (5)}$$

On the basis of the formulas (2) and (3), the pixel value Wm of the water image (W image) can be calculated from the following formula (6).

$$Wm = (X_2 + X_1)/2 \qquad \text{Formula (6)}$$

Additionally, the pixel value Fm of the fat image (F image) can be calculated from the following formula (7).

$$Fm = (X_2 - X_1)/2 \qquad \text{Formula (7)}$$

Further, the pixel value Wm+Fm(=Sm) of the normal image (W+F image) is given by the following formula (8), and is equal to the pixel value $X_2$ of the primary image $IM_0$.

$$Sm = Wm + Fm = X_2 \qquad \text{Formula (8)}$$

Even in the case of using the primary image $IM_{+\pi}$, instead of the primary image $IM_{-\pi}$, the pixel value Wm of the water image and the pixel value Fm of the fat image can be calculated from the formulas (5) and (3). Under the assumption that neither non-uniformity of a static magnetic field nor non-uniformity of a magnetic field due to magnetic susceptibility distribution of an object exists and attenuation due to T2 relaxation does not exist, the water image and the fat image can be separated from each other on the basis of the two primary images acquired by the two-point Dixon method. However, in a precise sense, the above-described assumption is not satisfied. When the above-described assumption is not satisfied, it is preferable to use the three-point Dixon method or the M-point Dixon method (where M is four or more).

By performing the above-described processing on respective pixels, it is possible to generate a water image (i.e., an image in which a fat component is suppressed), a fat image (i.e., an image in which a water component is suppressed), and a normal image, as the secondary images. Additionally, those water image, fat image, and normal image are generated for each of plural echo times TE which are different from each other such as TE1, TE2, and TE3.

Returning to FIG. 4 again, in the step ST104, the processing circuitry 40 calculates tissue parameters of an object such as a value of each transverse relaxation time T2 from the secondary images corresponding to plural echo times TE which are different from each other, according to its T2 computation function 405 shown in FIG. 2.

In the step ST105 of FIG. 4, the processing circuitry 40 sets a pulse sequence for calculating T1 values.

In the next step ST106, the scanner 500 performs the pulse sequence for calculating T1 values so as to acquire MR signals from the object.

The processing of the steps ST105 and ST106 may be performed in succession to the steps ST100 and ST101. Additionally or alternatively, the processing of the steps ST105 and ST106 may be performed as another examination independent of the steps ST100 and ST101.

In the step ST107, the processing circuitry 40 calculates T1 values as a tissue parameter of the object on the basis of the MR signals acquired in the step ST106.

In the next step ST108, the processing circuitry 40 generates computed images from pixel values of the secondary images and tissue parameters of the object (i.e., the calculated T1 values and T2 values), according to its computed-image generation function 404 shown in FIG. 2.

The processing of each of the step ST104, the step ST107, and the step ST108 will be described in detail with reference to FIG. 9 and FIG. 10. Note that the generation method of computed images described below is merely one example and embodiments of the present disclosure are not limited to the generation method described below.

Figure 9:
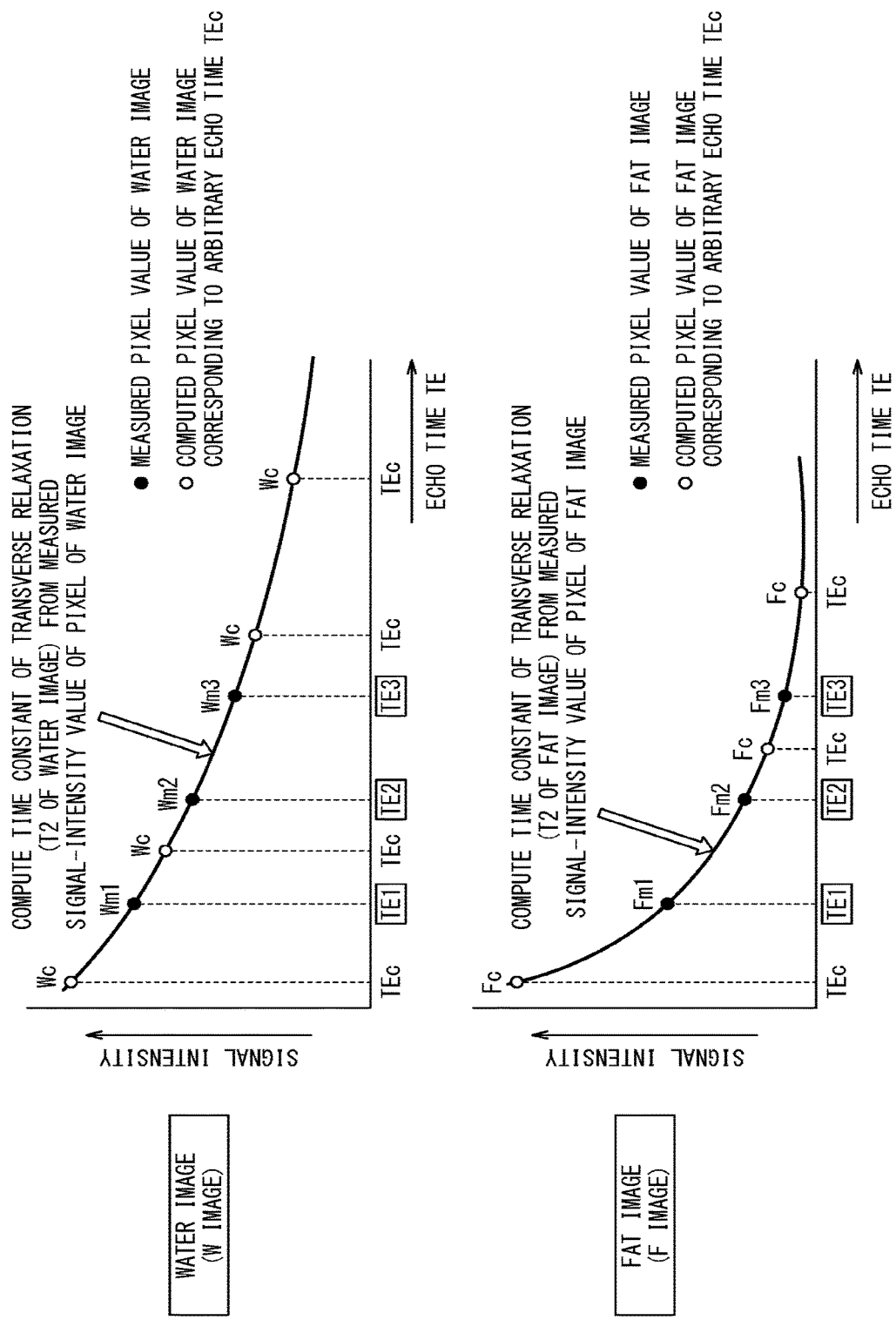
FIG. 9 is a conceptual diagram illustrating processing of generating a computed image from secondary images.

As shown in FIG. 9, signal intensity (i.e., pixel value) of each pixel of the water image and the fat image exponentially decreases with respect to an echo time TE due to transverse relaxation. This property is used for calculating a time constant of an exponential function from pixel values of the water image and the fat image acquired under an actual imaging sequence, and then the transverse relaxation time of each of the water image and fat image can be determined on the basis of the calculated time constant. Pixel values of the water image and the fat image at an arbitrary echo time TEc can be calculated from the calculated transverse relaxation times and the measured pixel values. Details of this calculation will be described below.

When pixel value of the water image is defined as Wm, the pixel value Wm can be approximated by the following formula (9).

$$Wm = W_0 * \exp(-TE/T2_w) \qquad \text{Formula (9)}$$

In the formula (9), $W_0$ is a constant, and $T2_w$ is a transverse relaxation time of a water component of an object.

Under the condition that the echo times TE1 and TE2 are different from each other, it is assumed that $Wm_1$ is a measured pixel value of an arbitrary pixel of the water image with respect to the echo time TE1 (i.e., arbitrary pixel value determined from MR signals acquired in the actual imaging sequence) and $Wm_2$ is a measured pixel value of an arbitrary pixel of the water image with respect to the echo time TE2. As to $Wm_1$ and $Wm_2$, the following formulas (10) and (11) are established.

$$Wm_1 = W_0 * \exp(-TE1/T2_w) \qquad \text{Formula (10)}$$

$$Wm_2 = W_0 * \exp(-TE2/T2_w) \qquad \text{Formula (11)}$$

On the basis of the formulas (10) and (11), the transverse relaxation time $T2_w$ of the water component of the object can be calculated from the following formula (12).

$$T2_w = -(TE1-TE2)/\ln(Wm_1/Wm_2) \qquad \text{Formula (12)}$$

In the formula (12), ln( ) indicates a natural logarithm of number in parenthesis.

When a calculated pixel value of an arbitrary pixel of the water image for an arbitrary echo time TEc is defined as Wc, Wc can be calculated from the formula (13).

$$Wc = Wm_1 * \exp\{-(TEc-TE1)/T2_w\} \qquad \text{Formula (13)}$$

The calculation of the formulas (10) to (13) is calculation for one pixel. Thus, it is possible to generate a computed image of the water image at an arbitrary echo time TEc (i.e., a computed image of a fat-suppressed image) by performing the calculation of the formulas (10) to (13) on all the pixels.

In a similar manner as described above, a computed image of the fat image (F image) can also be generated. For instance, it is assumed that $Fm_1$ and $Fm_2$ respectively indicate a measured pixel value of an arbitrary pixel of the fat image at the echo time TE1 and a measured pixel value of an arbitrary pixel of the fat image at the echo time TE2 which is different from the echo time TE1. Under this assumption, the transverse relaxation time $T2_F$ of the fat component of the object can be calculated from the following formula (14) in a manner similar to the case of the formula (12).

$$T2_F = -(TE1-TE2)/\ln(Fm_1/Fm_2) \qquad \text{Formula (14)}$$

Next, a calculated pixel value of an arbitrary pixel of the fat image at an arbitrary echo time TEc is defined as Fc, Fc can be calculated from the following formula (15).

$$Fc = Fm_1 * \exp\{-(TEc-TE1)/T2_F\} \qquad \text{Formula (15)}$$

By performing the calculation of the formulas (14) and (15) on all the pixels, it is possible to generate a computed image of the fat image (F image) at an arbitrary echo time TEc (i.e., a computed image of a water-suppressed image).

Although duplicate description is omitted, it is also possible to generate a computed image of the normal image at an arbitrary echo time TEc in a similar manner as described above.

It is possible to acquire a T2 map of the fat-suppressed image (i.e., water image) and a T2 map of the water-suppressed image (i.e, fat image), by determining both of a transverse relaxation time $T2_w$ of a water component computed by the formula (12) and a transverse relaxation time $T2_F$ of a fat component computed by the formula (14) for all the pixels, as shown in FIG. 3. A T2 map of the normal image can be acquired in a similar manner as described above.

As is clear from the above description, a transverse relaxation time T2 can be generated when measured values of respective pixel values for two echo times TE1 and TE2 are acquired. However, when noise is superimposed on measured pixel values of respective pixels, there is a possibility that calculation accuracy of the transverse relaxation time T2 is reduced. Thus, as shown in FIG. 9, the transverse relaxation time T2 can be precisely calculated by estimating the transverse relaxation time T2 from measured pixel values of respective pixels for the three echo times TE1, TE2, TE3, or four or more echo times with the use of, e.g., a curve fitting method.

According to the MRI apparatus 1 of the present embodiment as described above, actual imaging of an object is performed by executing the pulse sequence shown in FIG. 5 or FIG. 6 only once. By using data acquired in the one-time imaging, respective images corresponding to arbitrary echo times can be generated through ex-post calculation not only as a normal image but also as a fat-suppressed water image and/or a water-suppressed fat image.

For instance, it is possible to generate a fat-suppressed T2 weighted image, a water-suppressed T2 weighted image, and/or a normal T2 weighted image through calculation on the basis of the data acquired in the one-time imaging, by setting the echo time TEc to a value equal to or longer than the transverse relaxation time T2.

Additionally, it is possible to generate a fat-suppressed proton-density weighted image, a water-suppressed proton-density weighted image, and/or a normal proton-density weighted image through calculation on the basis of the same data acquired in the actual imaging, by setting the echo time TEc to a value shorter than the transverse relaxation time T2. Although it is difficult to acquire an image whose transverse relaxation time T2 is zero in actual imaging, it is possible to compute an image whose transverse relaxation time T2 is logically zero according to the present embodiment.

Furthermore, by generating some computed images whose echo times TEc are different from each other, an image with a desired contrast can be obtained without performing an actual imaging sequence many times.

Although the above description has been given on the premise that influence of contrast due to longitudinal relaxation is small, it is possible to generate a computed image by reflecting influence of a longitudinal relaxation time.

Figure 10:
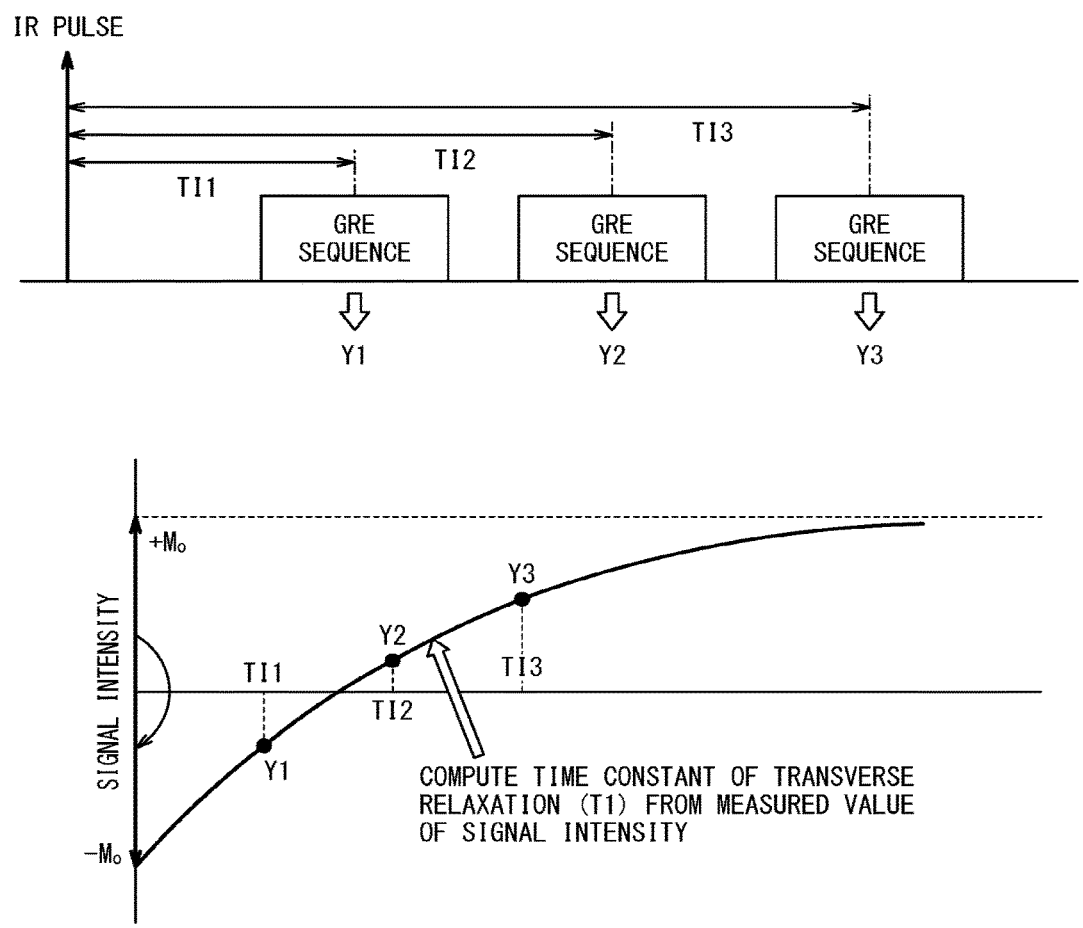
FIG. 10 is a conceptual diagram illustrating processing of computing a longitudinal relaxation time.

The upper part of FIG. 10 illustrates one case of a pulse sequence for computing a longitudinal relaxation time T1. In this pulse sequence, an inversion recovery method and a gradient echo (GRE) method are used in combination. After application of an inversion recovery (IR) pulse, an MR signal is acquired at each timing of plural inversion recovery times (such as TI1, TI2, and TI3) under the GRE method. As the result, it is possible to draw a graph illustrating change in MR-signal intensity with respect to an inversion recovery time TI as shown in the lower part of FIG. 10, and a time constant, i.e., a longitudinal relaxation time T1 can be computed from this graph.

Note that a pulse sequence for computing a longitudinal relaxation time T1 is not limited to the pulse sequence shown in FIG. 10. For instance, a longitudinal relaxation time T1 can be computed by performing a pulse sequence called MP2RAGE.

On the basis of the longitudinal relaxation time T1 computed in the above manner and the above-described transverse relaxation time T2, it is possible to compute each pixel value Wc of a water image and each pixel value Fc of a fat image by using, e.g., the following formulas (16) to (18) such that influence of longitudinal relaxation is reflected on the water image and fat image to be computed.

$$Wc = F(TRc, T1) * Wm_1 * \exp\{-(TEc-TE1)/T2_w\} \qquad \text{Formula (16)}$$

$$Fc = F(TRc, T1) * Fm_1 * \exp\{-(TEc-TE1)/T2_F\} \qquad \text{Formula (17)}$$

$$F(TRc, T1) = 1 - \exp(-TRc/T1) \qquad \text{Formula (18)}$$

Note that TRc in the formulas (16) to (18) indicates an arbitrary repetition time which is set at computation.

By using the formulas (16) to (18), it is possible to generate an image with contrast, on which not only transverse relaxation but also longitudinal relaxation are reflected, for each of the water image, the fat image, and the normal image.

For instance, it is possible to compute a fat-suppressed T1 weighted image, a water-suppressed T1 weighted image, or a normal T1 weighted image by setting a repetition time TRc to a value shorter than a longitudinal relaxation time T1 and setting an echo time TEc to a value shorter than a transverse relaxation time T2 on the basis of data acquired in one actual imaging sequence.

As to a longitudinal relaxation time T1, each of the formulas (16) to (18) does not distinguish between a longitudinal relaxation time T1 for a water image and a longitudinal relaxation time T1 for a fat image. However, a longitudinal relaxation time $T1_W$ for a water image and a longitudinal relaxation time $T1_F$ for a fat image may be separately computed.

For instance, a longitudinal relaxation time T1 is computed for each pixel by the method described with FIG. 10. In other words, a T1 map is computed by the method described with FIG. 10. Afterward, a longitudinal relaxation time T1 corresponding to the pixel position in the W image is extracted as a longitudinal relaxation time $T1_w$ for the water image from the computed T1 map. Similarly, a longitudinal relaxation time T1 corresponding to the pixel position in the F image is extracted as a longitudinal relaxation time $T1_F$ for the fat image from the computed T1 map. Further, it is possible to more accurately acquire a computed image of a fat-suppressed T1 weighted image by, e.g., applying the longitudinal relaxation time $T1_W$ extracted for the water image to the formula (16). Similarly, it is possible to more accurately acquire a computed image of a water-suppressed T1 weighted image by, e.g., applying the longitudinal relaxation time $T1_F$ extracted for the fat image to the formula (17). As to a T1 map for the normal image, the T1 map computed by the method described with FIG. 10 can be used without any change.

(Modification of First Embodiment)

Pulse sequences different from that shown in FIG. 6 will be described as modifications of the first embodiment. Note that each modification described below is the same as the above-described first embodiment in terms of hardware configuration and a processing flow except some different points in pulse sequence.

Figure 11:
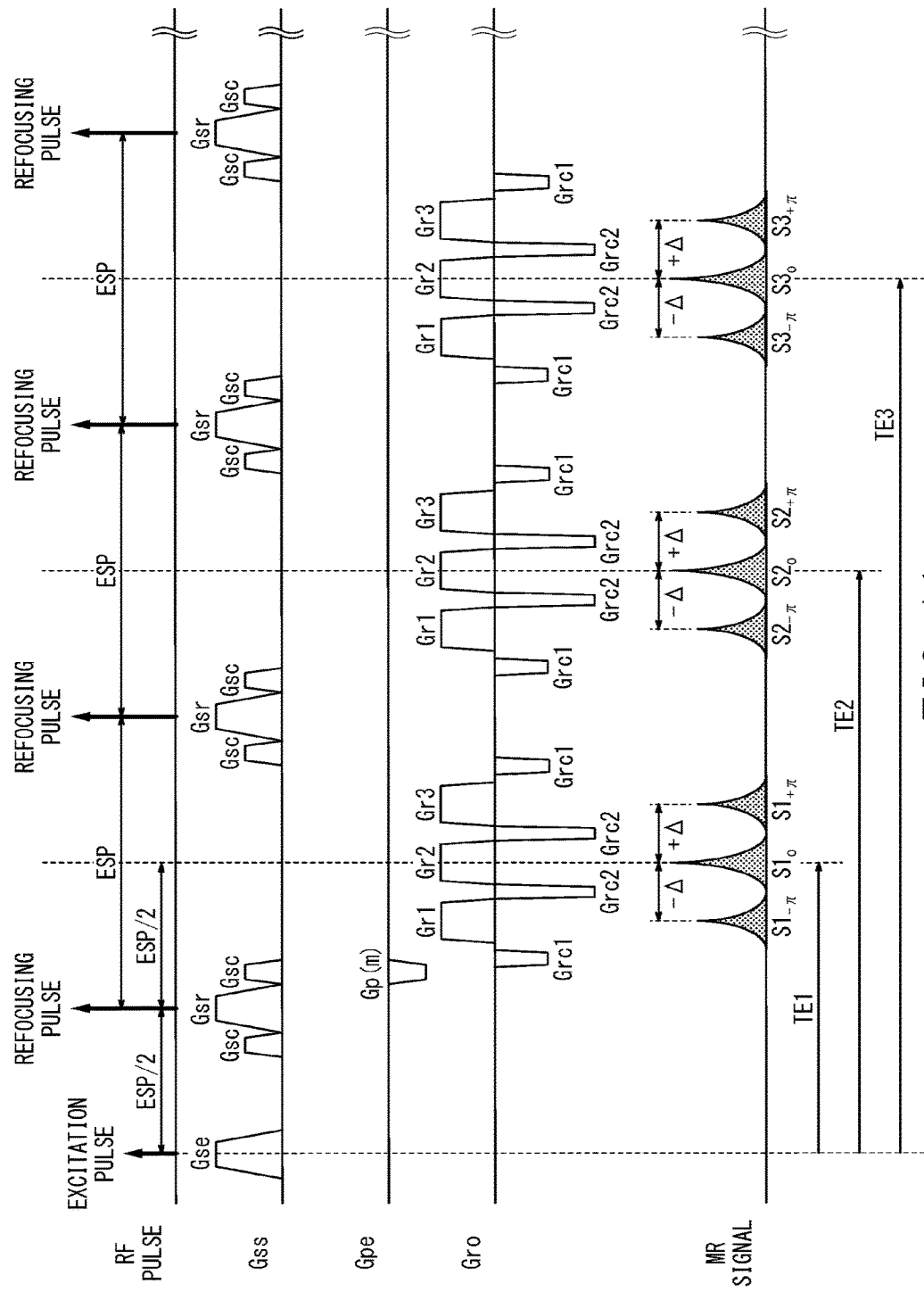
FIG. 11 is a timing chart illustrating the pulse sequence of the first modification of the first embodiment.

FIG. 11 is a timing chart illustrating the pulse sequence of the first modification. The pulse sequence shown in FIG. 11 is different in method of applying readout gradient pulses from that shown in FIG. 6.

Although polarities of the three readout gradient pulses Gr1, Gr2, Gr3 between adjacent two refocusing pulses are alternately reversed (i.e., from negative to positive, and from positive to negative) in the pulse sequence shown in FIG. 6, polarities of the three readout gradient pulses Gr1, Gr2, Gr3 are the same (i.e., positive) in the pulse sequence shown FIG. 11.

In FIG. 11, each readout gradient pulse Grc2 between the readout gradient pulses Gr1 and Gr2 has a negative polarity and is applied as a prephasing gradient magnetic field in order to position the peak of the MR signal at the center of the readout gradient pulse Gr2. Similarly, in FIG. 11, each readout gradient pulse Grc2 between the readout gradient pulses Gr2 and Gr3 has a negative polarity and is applied as a prephasing gradient magnetic field in order to position the peak of the MR signal at the center of the readout gradient pulse Gr3. Thus, the area of each readout gradient pulse Grc2 is set to a half of the area of the readout gradient pulse Gr2 or Gr3.

When polarities of the three readout gradient pulses Gr1, Gr2, Gr3 are alternately reversed (i.e., from negative to positive, and from positive to negative) as shown in FIG. 6, a data arrangement direction is reversed between k-space data being read out by a readout gradient pulse having a negative polarity and k-space data being read out by a readout gradient pulse having a positive polarity. In this case, rearrangement processing is required such that all the acquired k-space data coincide with each other in terms of data arrangement direction. By contrast, when polarities of the three readout gradient pulses Gr1, Gr2, Gr3 are the same as each other as shown in FIG. 11, such rearrangement processing is unnecessary.

Further, when polarities of the readout gradient pulses are reversed as described below, there is difference in peak position between an MR signal being read out by a readout gradient pulse having a positive polarity and another MR signal being read out by a readout gradient pulse having a negative polarity due to, e.g., distortion of gradient magnetic fields in some cases. Thus, it is required to perform correction processing for matching the peak positions of respective MR signals in addition to the processing for matching the data arrangement direction.

Since polarities of readout gradient pulses are the same in the pulse sequence shown in FIG. 11 but are reversed in the pulse sequence shown in FIG. 6, the pulse sequence shown in FIG. 11 has an advantage over the pulse sequence shown in FIG. 6 in that neither the above-described correction processing nor the processing of unifying the data arrangement direction is necessary.

However, in the pulse sequence shown in FIG. 11, it is required to apply each prephasing gradient pulse Grc2 having a large slew rate. Thus, temporal change in magnetic field (i.e., dB/dt) is larger in the pulse sequence shown in FIG. 11. Hence, as to nerve stimulation due to dB/dt, more attention should be paid in the pulse sequence shown in FIG. 11 than the pulse sequence shown in FIG. 6.

Figure 12:
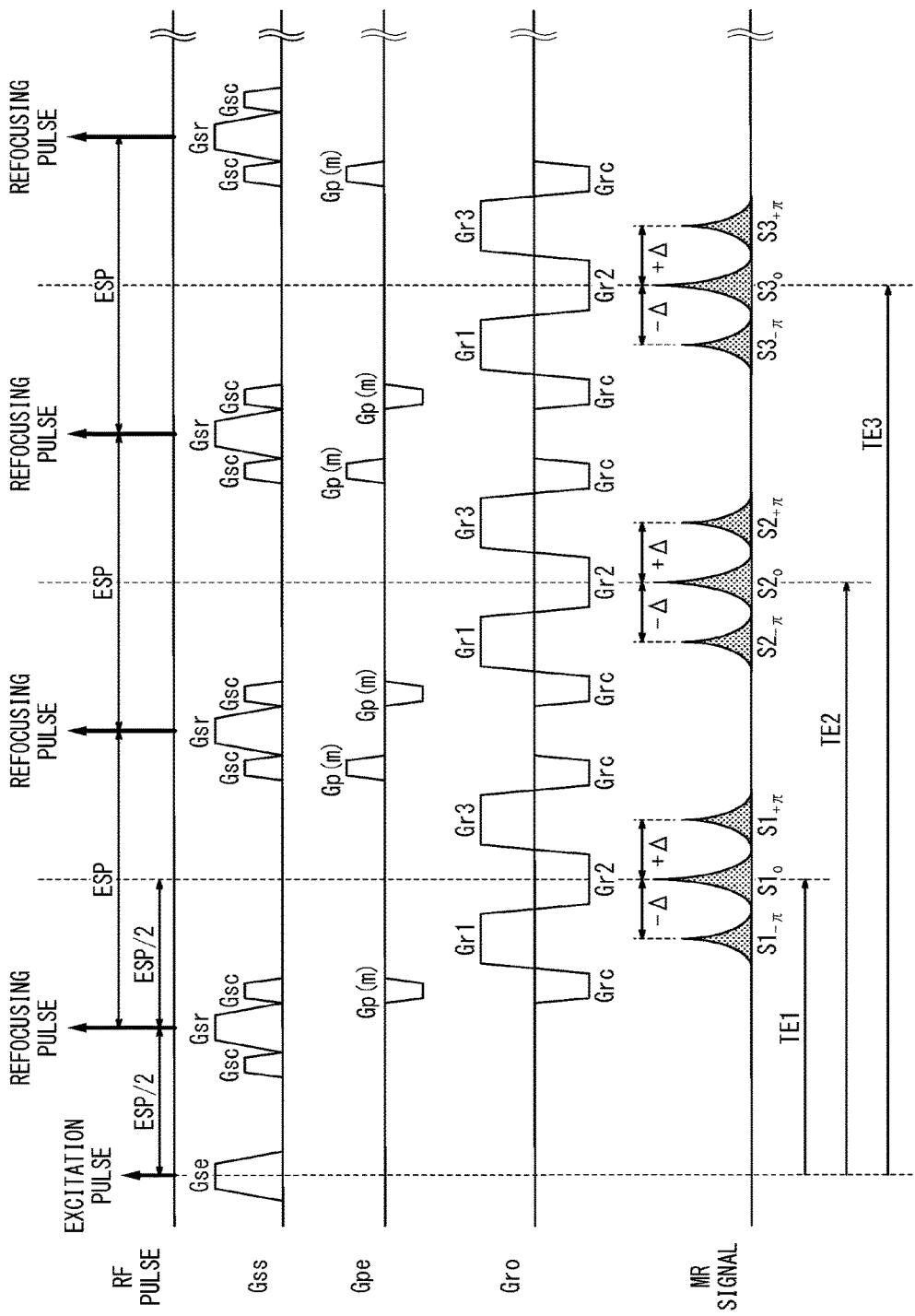
FIG. 12 is a timing chart illustrating the pulse sequence of the second modification of the first embodiment.

FIG. 12 is a timing chart illustrating the pulse sequence of the second modification. The pulse sequence of the second modification satisfies so-called Carr-Purcell-Meiboom-Gill (CPMG) conditions. The CPMG conditions include the following conditions (1) and (2).

Condition (1): The interval ESP between adjacent two refocusing pulses is twice the interval between the excitation pulse and the first refocusing pulse, and the phase of each refocusing pulse is shifted by 90 degrees from the phase of the excitation pulse.

Condition (2): In every interval between adjacent two refocusing pulses, a time integration value of intensity of all the gradient pulses (applied in this interval) is the same value.

When the CPMG conditions are satisfied, there is an advantage that an SN ratio is improved because a spin echo SE and a stimulated echo STE are added to each other at the same position in the temporal axis under the state where the phase of the spin echo SE is the same as the phase of the stimulated echo STE.

In the pulse sequence shown in FIGS. 6 and 11, the phase encoding gradient pulse Gp(m) is applied only once between the first and second refocusing pulses but is not applied after the second refocusing pulse. Accordingly, although the same phase encode is given to respective echo signals corresponding to a series of refocusing pulses subsequent to one excitation pulse, the condition (2) of the CPMG conditions is not satisfied in the pulse sequence shown in FIGS. 6 and 11.

By contrast, in the pulse sequence shown in FIG. 12, a pair of phase encoding gradient pulses Gp(m) whose polarities are opposite to each other are applied between each interval between adjacent two refocusing pulses. Additionally, an absolute value of intensity of each of a pair of phase encoding gradient pulses Gp(m) is set to the same value Gp(m) in every interval between adjacent two refocusing pulses. In each interval between adjacent two refocusing pulses, the phase encoding gradient pulse Gp(m), which is negative Gp(m) in FIG. 12, prior to the readout gradients Gr1, Gr2, and Gr3 is applied for setting phase encode amount, while the phase encoding gradient pulse Gp(m), which is positive Gp(m) in FIG. 12, after the readout gradients Gr1, Gr2, and Gr3 is applied as a rewinder gradient so as to null the integration of the phase encoding gradient between the adjacent two refocusing pulses.

Accordingly, the same phase encode is given to respective echo signals corresponding to a series of refocusing pulses subsequent to one excitation pulse, and a time integration value of intensity of all the gradient pulses applied in every interval between adjacent two refocusing pulses becomes the same value. Hence, the CPMG conditions are satisfied.

A time integration value of intensity of all the phase encoding gradient pulses applied in every interval between adjacent two refocusing pulses is zero. Similarly, a time integration value of intensity of all the readout gradient pulses applied in every interval between adjacent two refocusing pulses is zero, whereas the same does not hold true for slice selective gradient pulses.

Since the second modification shown in FIG. 12 satisfies the CPMG conditions, the second modification is superior to the pulse sequence shown in FIG. 6 in terms of SN ratio. Since the second modification requires more application of phase encoding gradient pulses than the pulse sequence shown in FIG. 6, the second modification is slightly inferior to the pulse sequence shown in FIG. 6 in terms of specific absorption rate (SAR) and the above-described dB/dt.

Figure 13:
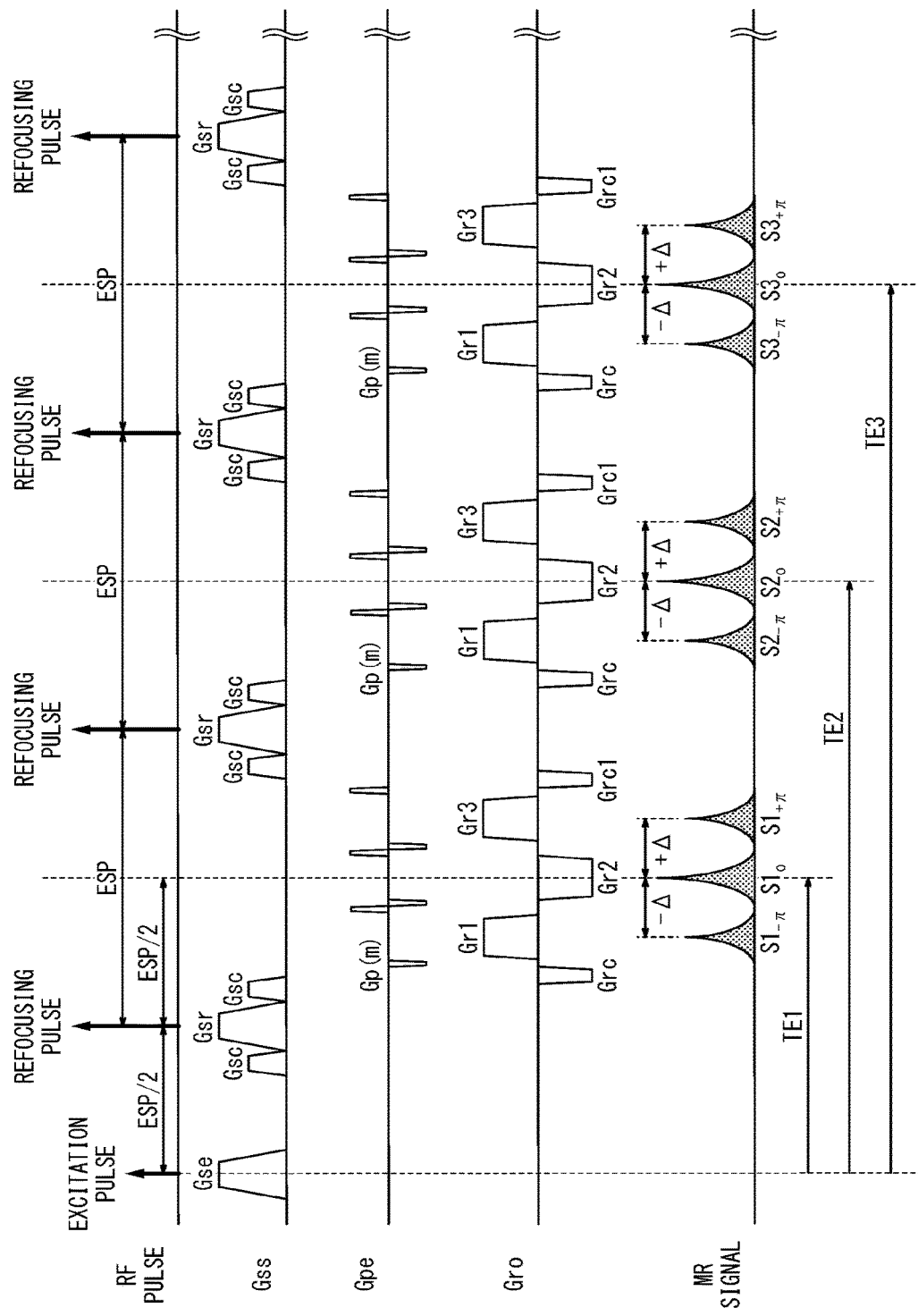
FIG. 13 is a timing chart illustrating the pulse sequence of the third modification of the first embodiment.

FIG. 13 is a timing chart illustrating the pulse sequence of the third modification. In the pulse sequence of the third modification, a phase encoding gradient pulse Gp(m) is applied immediately before application of each of the readout gradient pulse Gr1, Gr2, Gr3, and a rewinder gradient pulse is applied immediately after application of each of the readout gradient pulse Gr1, Gr2, Gr3. The polarity of each rewinder gradient pulse is opposite to the polarity of the phase encoding gradient pulse Gp(m). Additionally, the property of each of the phase encoding gradient pulses Gp(m) is common to every interval between adjacent two refocusing pulses, and the same holds true for the rewinder gradient pulses.

The pulse sequence shown in FIG. 13 also satisfies the CPMG conditions similarly to the second modification, and the same phase encode is given to respective echo signals corresponding to a series of refocusing pulses subsequent to one excitation pulse. Thus, the third modification has almost the same merit and demerit as the second modification.

Although the pulse sequences of each of the first to third modifications has the above-described merit and demerit as compared with the pulse sequence shown in FIG. 6, the MRI apparatus 1 of the present embodiment can perform the pulse sequences of any of the first to third modifications instead of the pulse sequence shown in FIG. 6.

(Second Embodiment)

Figure 14:
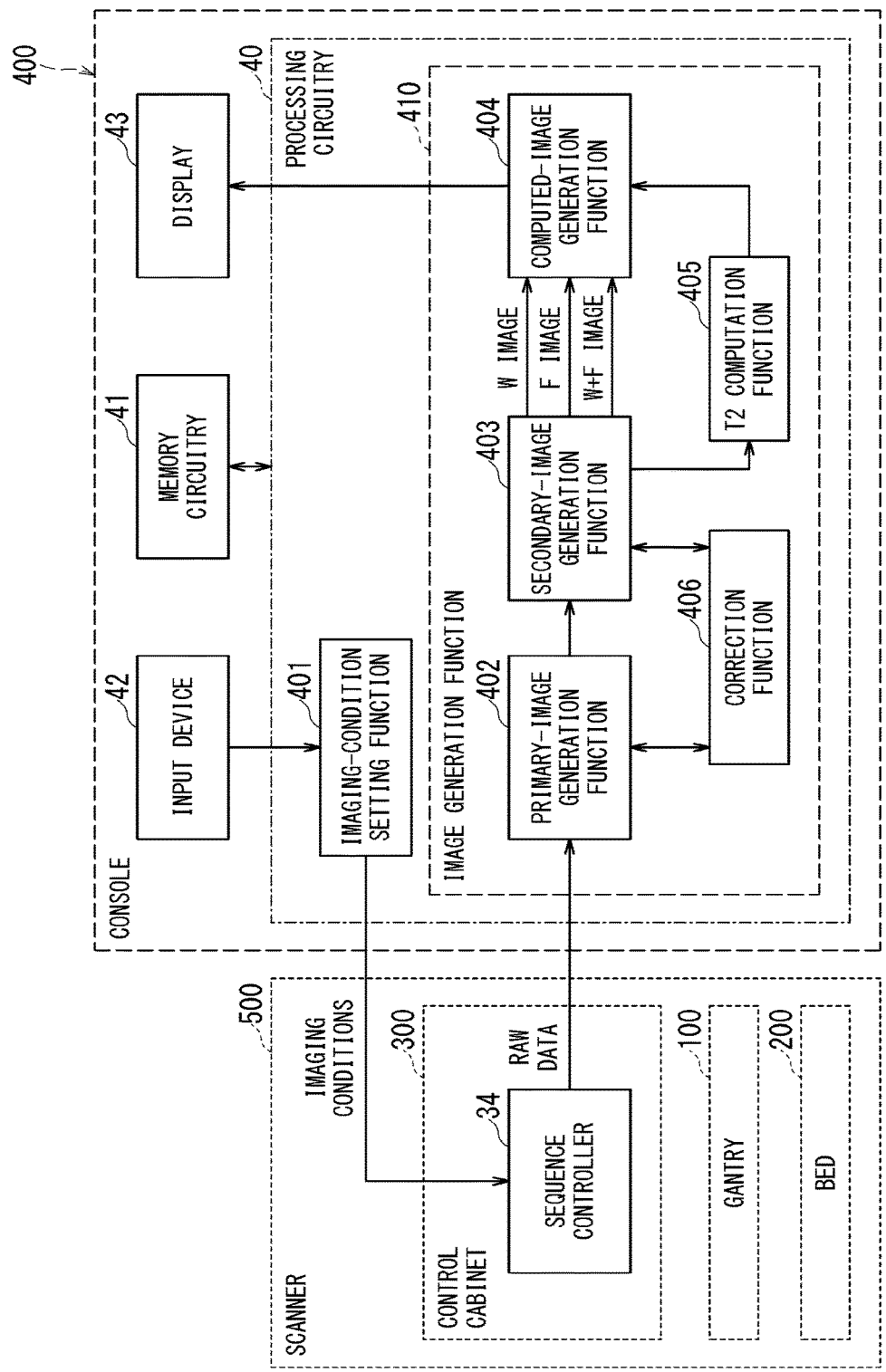
FIG. 14 is a block diagram illustrating overall configuration of the MRI apparatus of the second embodiment.

FIG. 14 is a block diagram illustrating overall configuration of the MRI apparatus 1 of the second embodiment. The MRI apparatus 1 of the second embodiment is the same as that of the first embodiment (FIG. 2) except that a correction function 406 is further included in the second embodiment. Thus, all the other points are common to the first and second embodiments and the same reference signs are used for the same components. The first and second embodiments are different from each other in terms of function (i.e., correction function 406) but are the same as each other in terms of hardware configuration.

Figure 15:
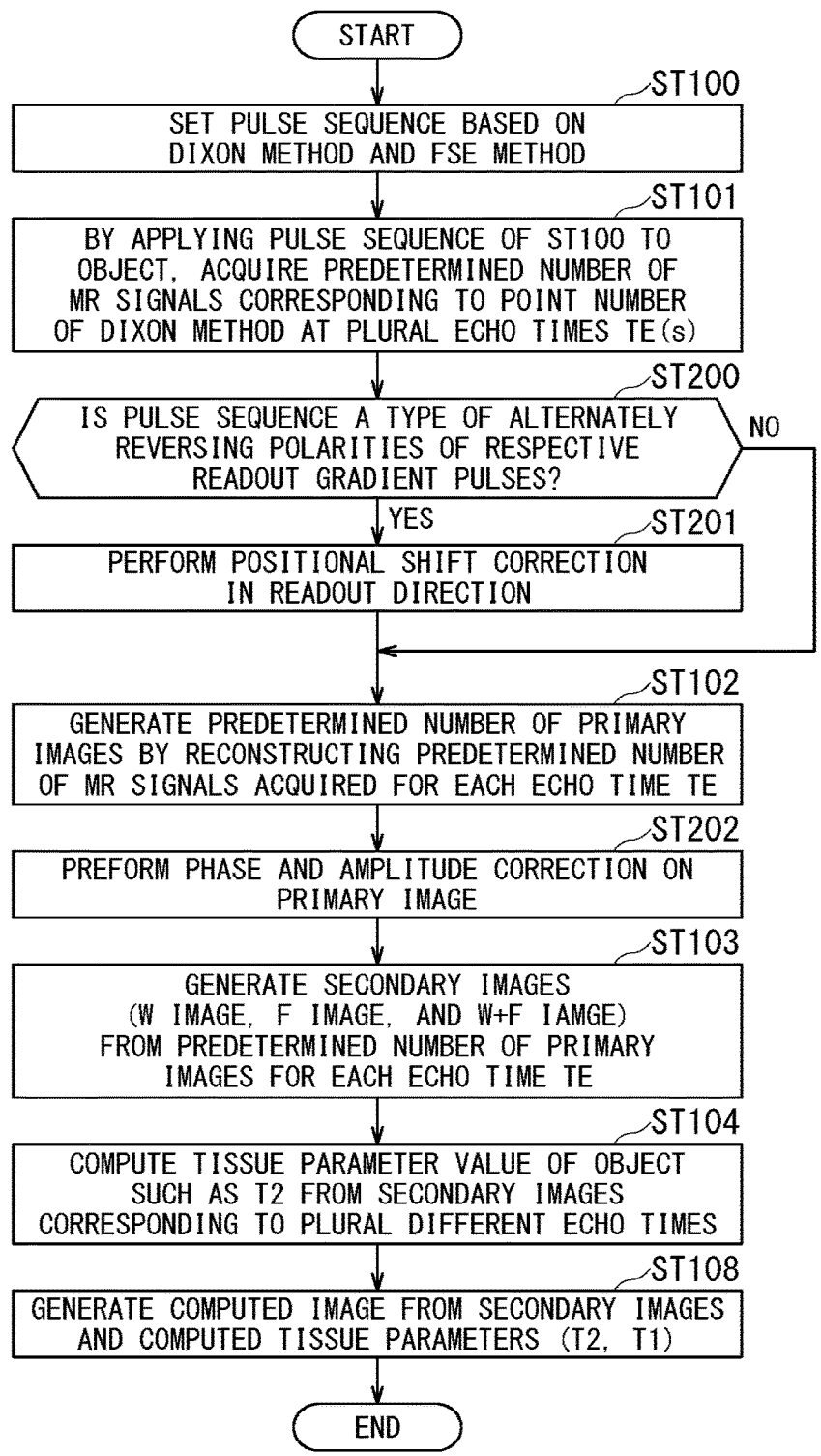
FIG. 15 is a flowchart illustrating an operation performed by the MRI apparatus of the second embodiment.

FIG. 15 is a flowchart illustrating an operation performed by the MRI apparatus 1 of the second embodiment. The operation of the second embodiment is different from that of the first embodiment in that processing of the steps ST200, ST201, and ST202 is added to the processing of the first embodiment. The rest of the processing in FIG. 15 is substantially the same as that of the first embodiment, and the same step number is assigned for the same processing in FIG. 15. Note that the processing of the steps ST200, ST201, and ST202 is performed by the correction function 406 of the processing circuitry 40 in FIG. 14.

After MR signals are acquired by one of the pulse sequences shown in FIGS. 6, 11, 12, and 13 in the step ST101, in the next step ST200, the processing circuitry 40 determines whether the applied pulse sequence is a type of alternately reversing polarities of respective readout gradient pulses between positive and negative or not. When MR signals are acquired by a pulse sequence in which readout gradient pulses of the same polarity are applied, i.e., when MR signals are acquired by a pulse sequence like the one in FIG. 11, the processing proceeds to the step ST102.

In the meantime, when MR signals are acquired by a pulse sequence in which polarities of respective readout gradient pulses are alternately reversed between positive and negative, i.e., when MR signals are acquired by a pulse sequence like the one in FIG. 6, FIG. 12, or FIG. 13, the processing proceeds to the step ST201.

Figure 16:
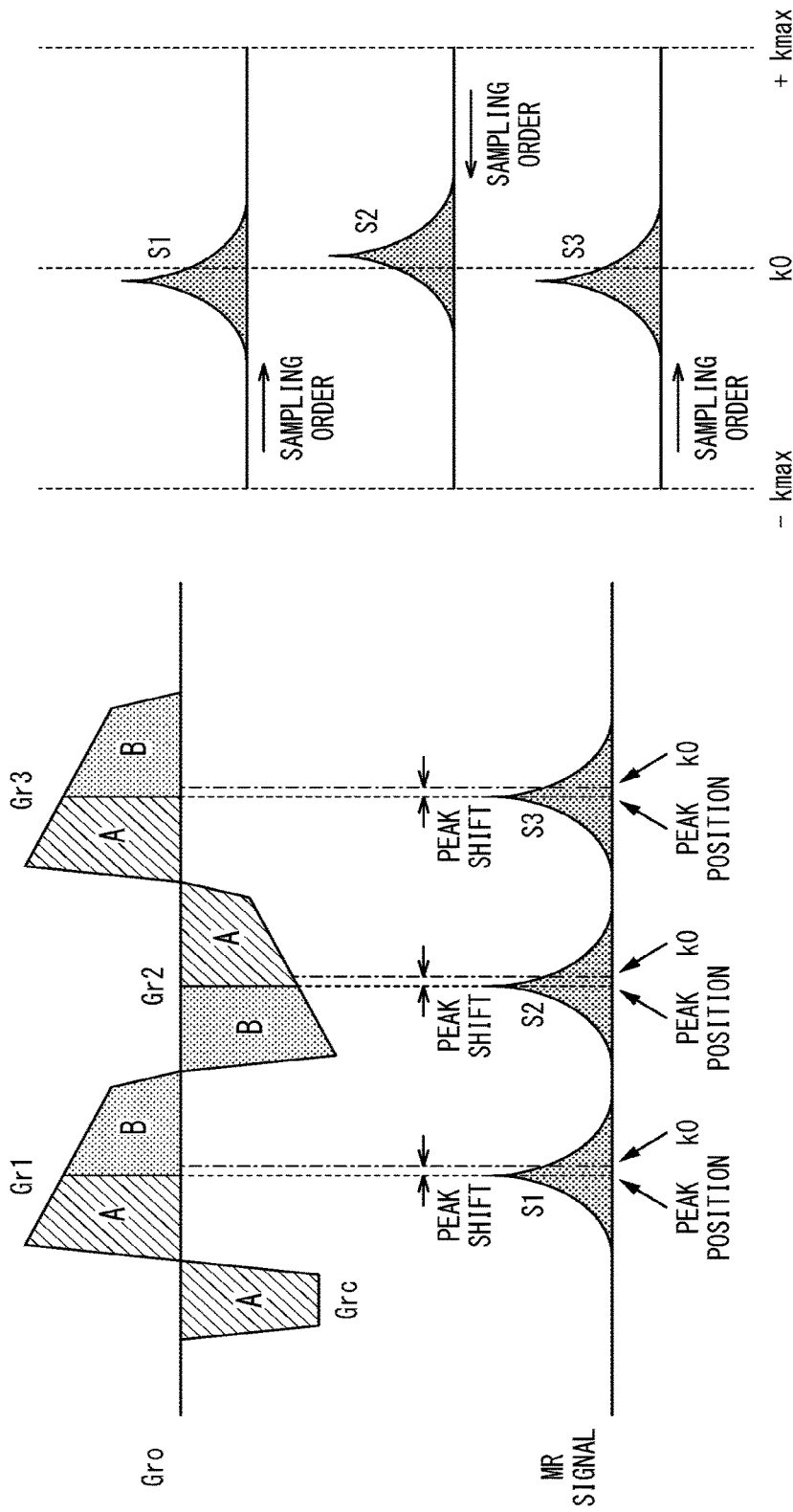
FIG. 16 is a schematic diagram illustrating positional shift of a peak of an MR signal in the readout direction.

In the step ST201, positional shift correction in the readout direction is performed. FIG. 16 is a schematic diagram illustrating positional shift in the readout direction which can be caused in the case of a pulse sequence of alternately reversing polarities of respective readout gradient pulses between positive and negative.

Each readout gradient pulse does not necessarily become a line-symmetric shape due to influence of, e.g., an eddy-current magnetic field. For instance, as shown in the upper left part of FIG. 16, the shape of each readout gradient pulse is asymmetric about the center in the temporal axis. In the waveform shown in FIG. 16, when each pulse is divided at the center in the temporal axis, the anterior half is stronger in intensity of a gradient magnetic field than the posterior half.

Since each gradient pulse is asymmetric as described above, the peak timing of the corresponding MR signal is shifted from the temporal center of the application period of each gradient pulse.

Specifically, the first MR signal reaches its peak at the timing when the area (i.e., time integration of magnetic field intensity) of the anterior side of the readout gradient pulse Gr1 having a positive polarity reaches (i.e., becomes equal to) the area A of the prior prephasing gradient pulse Grc having a negative polarity. The next MR signal reaches its peak at the timing when the area of the anterior side of the readout gradient pulse Gr2 reaches the area B of the posterior side of the prior readout gradient pulse Gr1. Further, the next MR signal reaches its peak at the timing when the area of the anterior side of the readout gradient pulse Gr3 reaches the area A of the posterior side of the prior readout gradient pulse Gr2.

In this case, the peak timing of every MR signal is shifted in the same direction as illustrated in the lower left of FIG. 16 (the peak is shifted to a timing prior to the center of the application period of each readout gradient pulse in the case of FIG. 16).

Meanwhile, MR signals read out with a positive readout gradient is opposite in arrangement direction of k-space to MR signals read out with a negative readout gradient pulse of a polarity. Sampling order of the MR signals read out with the positive readout gradient is from the negative maximum value to the positive maximum value in k-space. Meanwhile, sampling order of the MR signals read out with the negative readout gradient is from the positive maximum value to the negative maximum value in k-space. Thus, in order to match the arrangement directions in k-space, it is required to reverse the arrangement order of the MR signals read out with the negative readout gradient. As the result of this reversion processing, there occurs a shift in peak timing between the MR signals read out with a positive readout gradient and the MR signals read out with a negative readout gradient, as shown in the right side of FIG. 16.

In the step ST201, this shift in peak timing is corrected. A method of correcting the shift in peak timing is not limited to a specific method. For instance, the shift in peak timing may be corrected by using a correction template data. For example, the correction template data may be acquired by previously performing a preliminary pulse sequence, the same pulse sequence as the main scan. In the step ST202, phase correction and amplitude correction are performed on the primary image generated in the step ST102.

According to the above description of FIG. 8 and the primary images X1 to X3, the formulas (2) to (8) are based on the premise that attenuation due to T2 relaxation is negligible and there is not non-uniformity of a static magnetic field or non-uniformity of a magnetic field due to magnetic susceptibility distribution of an object.

However, it is actually difficult to perfectly eliminate non-uniformity of a static magnetic field, and, additionally, there also exists non-uniformity of a magnetic field due to magnetic susceptibility distribution of an object. Thus, phase variation due to such non-uniformity of the magnetic field occurs between the primary images. Additionally, amplitude variation also occurs between the primary images. The amplitude variation is caused by, e.g., attenuation due to T2 relaxation. In the step ST202, processing for correcting these phase variation and amplitude variation is performed.

Figure 17:
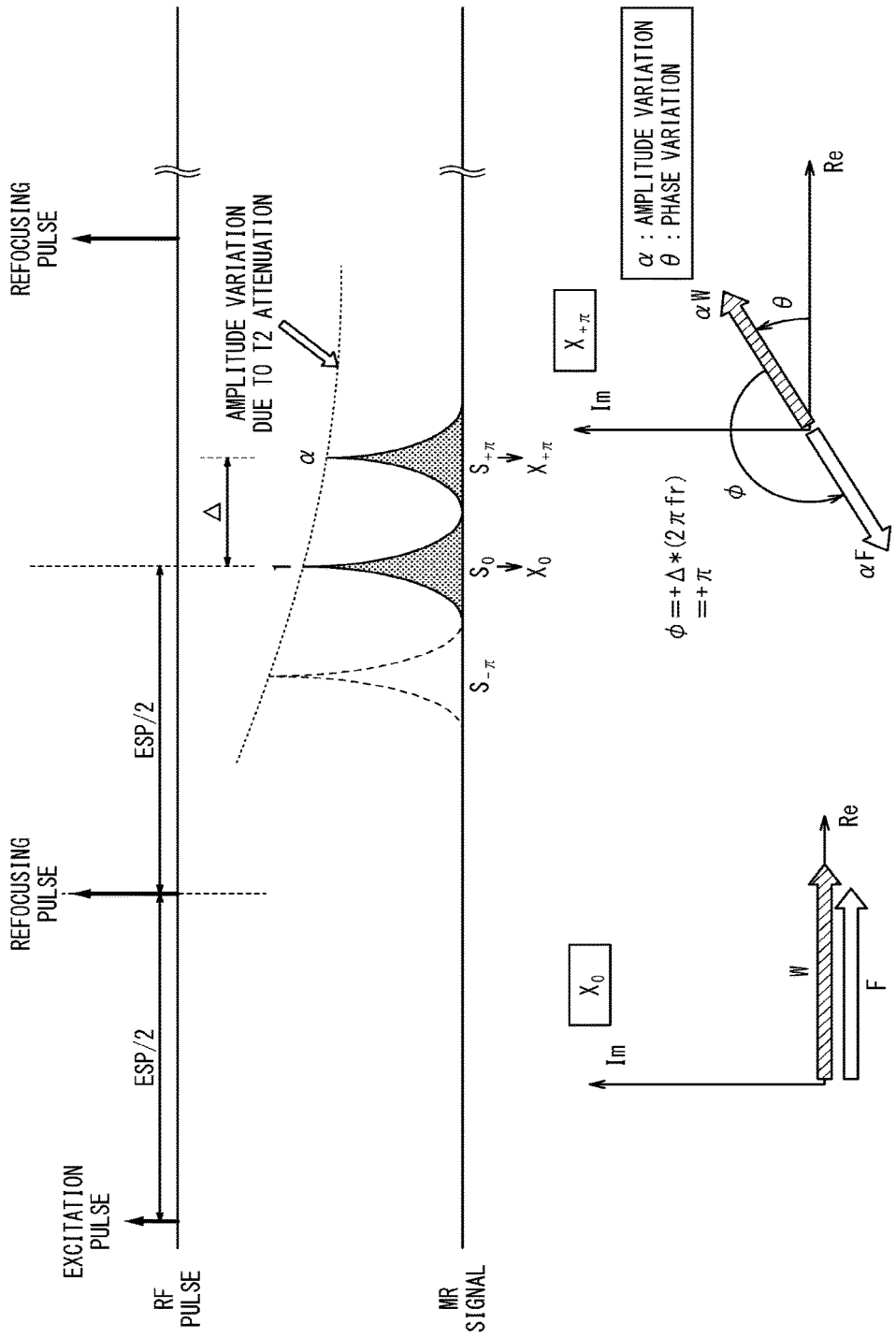
FIG. 17 is the first diagram illustrating concepts of phase fluctuation, amplitude fluctuation, and their correction.
Figure 18:
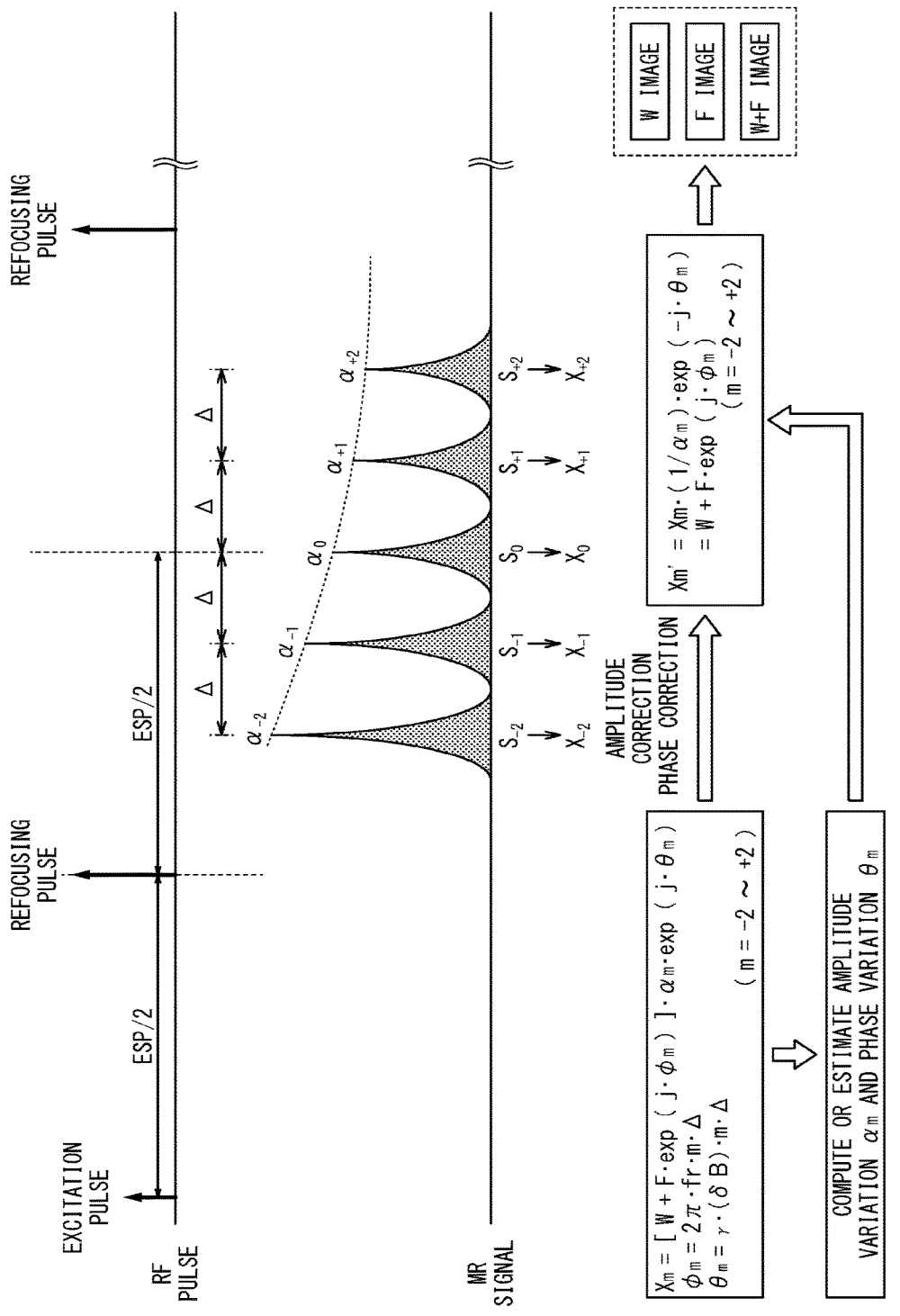
FIG. 18 is the second diagram illustrating concepts of phase fluctuation, amplitude fluctuation, and their correction.

FIG. 17 and FIG. 18 show phase variation due to non-uniformity of a magnetic field, concept of correction of this phase variation, amplitude variation caused by attenuation due to T2 relaxation, and concept of correction of this amplitude variation.

FIG. 17 schematically illustrates influence on the MR signals ($S1_0$, $S1_{+\pi}$) caused by T2 relaxation and/or non-uniformity of the magnetic field, out of the three MR signals ($S1_{-\pi}$, $S1_0$, $S1_{+\pi}$) shown in FIG. 6. Since the MR signals ($S2_0$, $S2_{+\pi}$) and the MR signals ($S3_0$, $S3_{+\pi}$) in FIG. 6 are influenced in a manner similar to the MR signals ($S1_0$, $S1_{+\pi}$), these MR signals are collectively described as ($S_0$, $S_{+\pi}$) in FIG. 17.

The upper part of FIG. 17 indicates RF pulses, and the middle part of FIG. 17 indicates MR signals. Out of the MR signals, $S_0$ is read out by the readout gradient pulse Gr2 shown in FIG. 6 and $S_{+\pi}$ is read out by the readout gradient pulse Gr3.

A pixel value of the primary image obtained by reconstructing the MR signals $S_0$ is defined as $X_0$, and a pixel value of the primary image obtained by reconstructing the MR signals $S_{+\pi}$ is defined as $X_{+\pi}$. The lower left part of FIG. 17 illustrates the pixel value $X_0$ on a complex plane, and the lower right part of FIG. 17 illustrates the pixel value $X_{+\pi}$ on a complex plane. It can be considered that amplitude and phase of the pixel value $X_0$ respectively correspond to amplitude and phase of the MR signal $S_0$ at the center (i.e., at the peak position) in the readout direction in k-space. Similarly, it can be considered that amplitude and phase of the pixel value $X_{+\pi}$ respectively correspond to amplitude and phase of the MR signal $S_{+\pi}$ at the center (i.e., at the peak position) in the readout direction in k-space.

Note that both of the transverse magnetizations of the water component W and the fat component F generated by an excitation pulse refocus at ESP/2 after an application timing of a refocusing pulse. Thus, as to the pixel value $X_0$, the phase of the water component W is equal to the phase of the fat component F. Meanwhile, phase variation due to non-uniformity of a magnetic field may occur. However, it should be noted that when a reference of phase variation is set to the phase at the timing which is ESP/2 after the application timing of the refocusing pulse, the phase of the water component W and the phase of the fat component F are both zero, as to the pixel value $X_0$.

Next, consider phase and amplitude of each of the water component W and the fat component F for the pixel value $X_{+\pi}$. When difference in magnetic resonance frequency between the fat component and the water component is defined as fr, the phase difference φ between the fat component and the water component for the pixel value $X_{+\pi}$ due to the frequency difference fr can be shown by the following formula (19) as described above.

$$\varphi = (2\pi) * fr * \Delta \qquad \text{Formula (19)}$$

By setting $\Delta$ to $\Delta=1/(2*fr)$, the phase difference φ between the fat component and the water component can be set to $\pi(=180°)$, and the complex signal vector of the fat component is oriented opposite to the complex signal vector of the water component as shown in the lower right part of FIG. 17.

As mentioned above, a magnetic field error (δB) exists due to non-uniformity of a static magnetic field and non-uniform magnetic susceptibility distribution inside an object. Thus, due to the magnetic field error (δB), the fat component and the water component are subjected to the phase variation θ(t) defined by the following formula (20).

$$\theta(t) = \gamma * (\delta B) * t \qquad \text{Formula (20)}$$

In the formula (20), "t" is time and "γ" is a gyromagnetic ratio. When the phase variation corresponding to the pixel value $X_0$ is treated as the reference, i.e., the time of the peak position of the MR signal $S_0$ is defined as t=0, the phase variation of the pixel value $X_{+\pi}$ with respect to the pixel value $X_0$ is given by the following formula (21).

$$\theta = \gamma * (\delta B) * \Delta \qquad \text{Formula (21)}$$

Magnitude of the magnetic field error (δB) is different for each spatial position. However, since both of the fat component and the water component are included in the same pixel, and thus, the fat component and the water component in the same pixel are subjected to the phase variation by the same amount. Thus, the fat component and the water component of the pixel value $X_{+\pi}$ are rotated by the phase variation θ, while keeping the phase difference φ=+π between the fat component and the water component as shown in the lower right part of FIG. 17.

Meanwhile, the fat component and the water component are subjected to amplitude variation a due to, e.g., attenuation caused by transverse relaxation. When the amplitude of the fat component of the pixel value $X_0$ is defined as F and the amplitude of the water component of the pixel value $X_0$ is defined as W, the amplitude of the fat component of the pixel value $X_{+\pi}$ becomes αF, and the amplitude of the water component of the pixel value $X_{+\pi}$ becomes αW as well, as shown in the lower right part of FIG. 17 on the premise that α≠1.

It is possible to correct the phase variation θ and the amplitude variation α of the pixel value $X_{+\pi}$ by determining the phase variation θ and the amplitude variation α from the pixel value $X_0$ and the pixel value $X_{+\pi}$. However, in order to accurately determine the phase variation θ and the amplitude variation α, information on two points (i.e., the pixel value $X_0$ and the pixel value $X_{+\pi}$) is not sufficient and it is desirable to use the three-point Dixon method or the M-point Dixon method where M is four or more.

FIG. 18 is a schematic diagram illustrating the concept of correcting the phase variation θ and the amplitude variation α, by using the five-point Dixon method as an example of the M-point Dixon method. In the five-point Dixon method shown in FIG. 18, five MR signals ($S_{-2}$, $S_{-1}$, $S_0$, $S_{+1}$, $S_{+2}$) are acquired between adjacent two refocusing pulses and five primary images ($X_{-2}$, $X_{-1}$, $X_0$, $X_{+1}$, $X_{+2}$) are reconstructed from those MR signals ($S_{-2}$, $S_{-1}$, $S_0$, $S_{+1}$, $S_{+2}$). Each pixel value of each of those primary images ($X_{-2}$, $X_{-1}$, $X_0$, $X_{+1}$, $X_{+2}$) is described as $X_m$ (m=−2 to +2) as well.

In this case, each pixel value $X_m$ can be obtained by the following formulas (22) to (24).

$$X_m = [W + F^* \exp(j^* \varphi_m)]^* \alpha_m^* \exp(j^* \theta_m) (m = -2 \text{ to } +2) \quad \text{Formula (22)}$$

$$\varphi_m = (2\pi)^* fr^* m^* \Delta (m = -2 \text{ to } +2) \quad \text{Formula (23)}$$

$$\theta_m = \gamma^* (\delta B)^* m^* \Delta (m = -2 \text{ to } +2) \quad \text{Formula (24)}$$

Although Δ is set in the above-described three-point Dixon method such that the phase at the peak position in each of the MR signals $S1_{-\pi}$, $S1_0$, $S1_{+\pi}$ becomes (−π, 0, +π), phase values are not limited to those values. As to setting of the interval Δ, it is sufficient that $\varphi_\pi$ takes plural phases different from each other within a range in which aliasing does not occur. For instance, in the case of the five-point Dixon method, the interval Δ between the respective peak positions of the five MR signals ($S_{-2}$, $S_{-1}$, $S_0$, $S_{+1}$, $S_{+2}$) can be set such that $\varphi_m$ takes the following values:

$$\varphi_m = [-(\tfrac{4}{5})\pi, -(\tfrac{2}{5})\pi, 0, +(\tfrac{2}{5})\pi, +(\tfrac{4}{5})\pi]$$

$θ_m$ indicated by the formulas (22) and (24) is the phase variation due to the magnetic field error (δB). Additionally, $α_m$ is the amplitude variation due to, e.g., T2 attenuation.

In the step ST202 of FIG. 15, for instance, the phase variation $θ_m$ and the amplitude variation $α_m$ are computed on the basis of the formulas (22) and (24). The computation method is not limited to a specific one but another method such as an analytical technique and a numerical analysis method may be used. For instance, by using the iterative algorithm described in US Patent Application Publication US 2011/0140696 A1, the phase variation $θ_m$ and the amplitude variation $α_m$ may be computed on the basis of the formulas (22) and (24).

When the phase variation $θ_m$ and the amplitude variation $α_m$ are computed, the pixel value $X_m'$ after correction can be determined by the following formula (25).

$$X_m' = X_m^* (1/\alpha_m)^* \exp(-j^* \theta_m) = [W + F^* \exp(j^* \varphi_m)]$$
$$(m = -2 \text{ to } +2) \quad \text{Formula (25)}$$

Further, it is possible to generate the water image (W image), the fat image (F image), and the normal image (W+F image), in each of which the phase variation $θ_m$ and the amplitude variation $α_m$ are corrected, by determining the pixel value W of the water component and the pixel value F of the fat component for each pixel from the pixel value $X_m'$ subjected to the correction.

In FIG. 15, the processing of the steps ST103, ST104, and ST108 subsequent to the step ST202 is the same as the first embodiment.

According to the MRI apparatus 1 of the second embodiment, a computed image can be generated from a water image and/or a fat image in each of which amplitude variation due to T2 attenuation is corrected and phase variation due to non-uniformity of a static magnetic field and non-uniform magnetic susceptibility distribution inside an object is also corrected.

For instance, a magnetic susceptibility artifact is generated due to non-uniform magnetic susceptibility distribution inside an object. According to the MRI apparatus 1 of the second embodiment, for instance, it is possible to generate, as computed images, a fat-suppressed image and a water-suppressed image in each of which a magnetic susceptibility artifact is suppressed.

Although fluid such as cerebrospinal fluid (CSF) involves large phase variation due to movement, such large phase variation can also be corrected according to the MRI apparatus 1 of the second embodiment. Thus, it is possible to generate, as a computed image, a water-suppressed image in which phase variation of CSF is corrected such as an image corresponding to a fluid attenuated inversion recovery (FLAIR) image.

(Third Embodiment)

Figure 19:
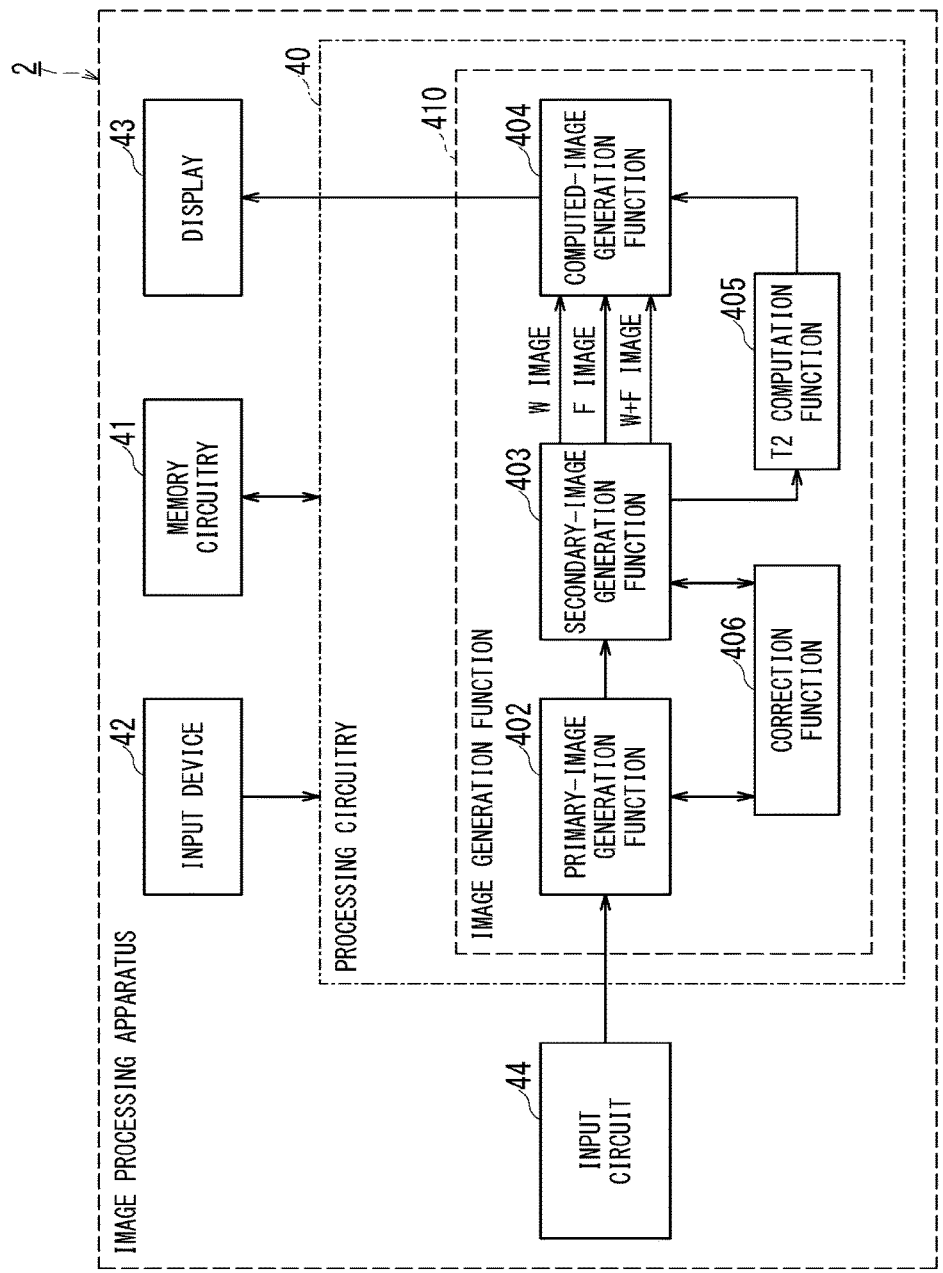
FIG. 19 is a block diagram illustrating overall configuration of the image processing apparatus of the third embodiment.

FIG. 19 is a block diagram illustrating configuration of an image processing apparatus 2 of the third embodiment. Although configuration of the image processing apparatus 2 is similar to the console 400 of the MRI apparatus 1 in the first and second embodiments, the third embodiment differs from the first and second embodiments in that the image processing apparatus 2 does not have the imaging-condition setting function 401 but includes the input circuit 44.

The input circuit 44 is a circuit configured to receive MR signals acquired by an MRI apparatus from an object under a pulse sequence illustrated in FIG. 6, FIG. 11, FIG. 12, or FIG. 13. The input circuit 44 is, e.g., an interface circuit configured to input data from a network. Additionally or alternatively, the input circuit 44 is, e.g., a data reading circuit from a memory medium such as an optical disc and a semiconductor memory.

The image processing apparatus 2 can perform, e.g., all the processing of the flowchart shown in FIG. 15 except the steps ST100 and ST101, and the same effects as the MRI apparatus 1 of the first and second embodiments can be obtained.

Although the image processing apparatus 2 receives MR signals and generates the primary images, the secondary images, and the computed images in the configuration shown in FIG. 19, embodiments of the image processing apparatus 2 is not limited to such an aspect. For instance, the MRI apparatus 1 may perform the processing of generating the primary images form MR signals and output the generated the primary images to the image processing apparatus 2 so that the image processing apparatus 2 performs the subsequent processing of generating the secondary images and the computed images. Additionally or alternatively, the MRI apparatus 1 may perform the processing of generating the primary images and secondary images form MR signals and output the generated the primary images and secondary images to the image processing apparatus 2 so that the image processing apparatus 2 performs the subsequent processing of generating the computed images.

According to the MRI apparatus or the image processing apparatus of at least one of the embodiments as described above, a desired compute image subjected to processing such as fat suppression can be generated with high precision.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus, comprising:
   a scanner equipped with at least a static magnetic field magnet configured to generate a static magnetic field, a gradient coil configured to apply gradient pulses, and an RF coil configured to apply RF pulses to an object and receive magnetic resonance signals from the object; and
   processing circuitry configured to
   set a pulse sequence in which a plurality of refocusing pulses are sequentially applied subsequent to application of one excitation pulse, and a predetermined number of magnetic resonance signals are acquired in each period between adjacent two refocusing pulses by using a water/fat separation method, in such a manner that the magnetic resonance signals are different in echo time TE for each of the plurality of refocusing pulses,
   cause the scanner to perform the pulse sequence and acquire the magnetic resonance signals under the pulse sequence, and
   generate a computed image from the magnetic resonance signals, the computed image being a magnetic resonance image of the object obtained by computation,
   wherein the water/fat separation method is a plural-point Dixon method; and
   the processing circuitry is further configured to
   generate primary images by the predetermined number from the magnetic resonance signals acquired by the plural-point Dixon method which corresponds to the predetermined number,
   generate a secondary image from the predetermined number of the primary images, the secondary image corresponding to at least one of a fat-suppressed image, a water-suppressed image, a water-fat image, and
   generate the computed image from the secondary image.

2. The MRI apparatus according to claim 1,
   wherein the processing circuitry is further configured to generate a fat-suppressed image as the computed image.

3. The MRI apparatus according to claim 2,
   wherein the processing circuitry is further configured to
   set another pulse sequence in which magnetic resonance signals for generating a T1 map are acquired,
   generate the T1 map,
   generate the fat-suppressed image as the computed image by using the T1 map.

4. The MRI apparatus according to claim 1,
   wherein the processing circuitry is further configured to
   compute a tissue parameter value of the object for each pixel of the secondary image, and
   generate the computed image, which corresponds to a sequence parameter value different from a sequence parameter value of the pulse sequence which has been actually performed for acquiring the magnetic resonance signals, by using the secondary image and the tissue parameter value of the object.

5. The MRI apparatus according to claim 4,
   wherein the tissue parameter value is a transverse relaxation time T2 of the object; and
   the sequence parameter value is an echo time TE.

6. The MRI apparatus according to claim 1,
   wherein the processing circuitry is further configured to
   generate a fat-suppressed image from the predetermined number of magnetic resonance signals acquired by the plural-point Dixon method, and
   generate at least one of a fat-suppressed T1 weighted image, a fat-suppressed T2 weighted image, and a fat-suppressed proton-density weighted image, as the computed image from the fat-suppressed image.

7. The MRI apparatus according to claim 1,
   wherein the processing circuitry is further configured to
   perform correction on a phase and amplitude of the predetermined number of the primary images for each pixel, based on phase information and amplitude information of the predetermined number of the primary images,
   generate the secondary image from the predetermined number of the primary images subjected to the correction, and
   compute the computed image from the secondary image.

8. The MRI apparatus according to claim 1,
   wherein the processing circuitry is further configured to
   set the pulse sequence in such a manner that readout gradient pulses are applied by the predetermined number in each period between adjacent two refocusing pulses and polarities of the predetermined number of the readout gradient pulses are alternately reversed between positive and negative.

9. The MRI apparatus according to claim 1,
   wherein the processing circuitry is further configured to
   set the pulse sequence in such a manner that readout gradient pulses are applied by the predetermined number in each period between adjacent two refocusing pulses and respective polarities of the predetermined number of the readout gradient pulses are the same.

10. The MRI apparatus according to claim 1,
    wherein the processing circuitry is further configured to
    set the pulse sequence in such a manner that a time-integrated value of intensity of gradient pulses applied in each period between two adjacent refocusing pulses is zero or a same value in every application direction of the gradient pulses.

11. The MRI apparatus according to claim 1,
    wherein the processing circuitry is further configured to
    set the pulse sequence in such a manner that readout gradient pulses are applied by the predetermined number in each period between adjacent two refocusing pulses, polarities of the predetermined number of the readout gradient pulses are alternately reversed between positive and negative, and a phase encoding gradient pulse and a rewinder gradient pulse having a polarity opposite to the phase encoding gradient pulse are applied for each of the predetermined number of the readout gradient pulses.

12. An image processing apparatus, comprising:
an input device configured to receive magnetic resonance signals acquired by a pulse sequence in which a plurality of refocusing pulses are sequentially applied subsequent to application of one excitation pulse, a predetermined number of magnetic resonance signals are acquired in each period between adjacent two refocusing pulses by using a water/fat separation method, and the magnetic resonance signals are different in echo time TE for each of the plurality of refocusing pulses; and
processing circuitry configured to generate a computed image from the magnetic resonance signals received by the input device, the computed image being a magnetic resonance image of the object obtained by computation,
wherein the water/fat separation method is a plural-point Dixon method; and
the processing circuitry is further configured to
generate primary images by the predetermined number from the magnetic resonance signals acquired by the plural-point Dixon method which corresponds to the predetermined number,
generate a secondary image from the predetermined number of the primary images, the secondary image corresponding to at least one of a fat-suppressed image, a water-suppressed image, a water-fat image, and
generate the computed image from the secondary image.

* * * * *